(12) United States Patent
Nakai et al.

(10) Patent No.: US 6,791,132 B2
(45) Date of Patent: Sep. 14, 2004

(54) MEMORY SEMICONDUCTOR DEVICE WITH REDUCED SENSE AMPLIFIER AREA

(75) Inventors: Kiyoshi Nakai, Ome (JP); Hidetoshi Iwai, Fussa (JP)

(73) Assignee: Hitachi, Ltd., Tokyo (JP)

( * ) Notice: Subject to any disclaimer, the term of this patent is extended or adjusted under 35 U.S.C. 154(b) by 123 days.

(21) Appl. No.: 10/041,601

(22) Filed: Jan. 10, 2002

(65) Prior Publication Data

US 2002/0093843 A1 Jul. 18, 2002

(30) Foreign Application Priority Data

Jan. 18, 2001 (JP) .................................. 2001-010787

(51) Int. Cl.[7] ............................................. H01L 31/119
(52) U.S. Cl. ...................... 257/296; 257/296; 257/905
(58) Field of Search ................................ 257/296, 298; 365/207, 203, 51, 190, 296

(56) References Cited

U.S. PATENT DOCUMENTS 5,325,336 A * 6/1994 Tomishima et al. ......... 365/207
5,602,772 A    2/1997 Nakano et al. ............... 365/51
5,629,887 A * 5/1997 Nakano et al. ............... 365/51
6,046,924 A * 4/2000 Isobe et al. .................. 365/51

FOREIGN PATENT DOCUMENTS

JP          7-254650          10/1995
JP          10-303387         11/1998

* cited by examiner

*Primary Examiner*—David Nelms
*Assistant Examiner*—Thinh T Nguyen
(74) *Attorney, Agent, or Firm*—Miles & Stockbridge P.C.

(57) ABSTRACT

In a semiconductor memory device which is intended to have a smaller sense amplifier forming area to match with small-sized bit lines, first bit lines BL (e.g., BL2a) are formed on a first layer, and lines M2 (e.g., M2a) are formed on a second layer and connected to the first bit lines in a first connecting area located between a first memory cell area and a sense amplifier area. Second bit lines BL (e.g., BL1c) are formed on the first layer, and lines M2 (e.g., M2c) are formed on the second layer and connected to the second bit lines in a second connecting area located between a second memory cell area and the sense amplifier area. As a result, the lines M2 on the second layer can have a smaller line interval.

12 Claims, 34 Drawing Sheets

MEMORY CELL FORMING AREA 1 OR 2

MEMORY SEMICONDUCTOR DEVICE WITH REDUCED SENSE AMPLIFIER AREA

BACKGROUND OF THE INVENTION

The present invention relates to a semiconductor integrated circuit device, and particularly to a technique which is applicable effectively to the sense amplifier section of DRAM (Dynamic Random Access Memory).

DRAM (Dynamic Random Access Memory) has an area for forming memory cells and a peripheral circuit area for forming circuits, e.g., sense amplifiers, for writing data onto the memory cells and reading data out of memory cells. A memory cell is made up of a capacitor C and a data transfer MISFET Qs which is connected at one end to the capacitor C, and it is formed at the intersection of a word line WL which is the gate electrode of the MISFET Qs and a bit line (data line) BL which is connected with one of source/drain regions of the MISFET Qs.

A sense amplifier SA is a circuit connected between bit lines BL and adapted to amplify a voltage difference of the bit lines BL.

In the trend of microstructuring of memory cells, the spacing between bit lines has become smaller, giving rise to the need of a breakthrough scheme for the connection of the bit lines to the sense amplifiers SA and the layout of the sense amplifiers SA.

For example, Japanese Patent Unexamined Publication No. Hei 10(1998)-303387 describes a technique of reducing the area for forming sense amplifier circuits based on the connection of a sense amplifier (SA0) to a main bit line pair (MBL0, /MBL0) by use of a sub bit line pair (SBL0, /SBL0) which extend along word lines.

Another Japanese Patent Unexamined Publication No. Hei 7(1995)-254650 (which corresponds to U.S. Pat. Nos. 5,602,772 and 5,629,887) describes a technique of relaxing the line interval in word line direction at the layout design of a sense amplifier block based on the arrangement of sense amplifier blocks in multiple columns along the word lines, whereas as conventionally sense amplifier blocks can be arranged in only one column in one cell array, by increasing the number of diffusion layers and wiring layers for connecting gate electrodes of transistors within the sense amplifier block.

SUMMARY OF THE INVENTION

In accompanying the reduction of bit line interval, the inventors of the present invention have studied the following technical affairs.

In the case of forming memory cells at all intersections of word lines and bit lines as shown in FIG. 1, the memory cell area can be reduced and the bit line interval can also be reduced. For example, for a memory cell structure shown in FIG. 33 and FIG. 34, which will be explained in detail later, a memory cell can be formed in an area of $6F^2$ (where F denotes the minimum working dimension).

A sense amplifier circuit, which is connected between bit lines as mentioned above, is also connected with common lines (common source lines) for driving the sense amplifier SA to the high or low level. The peripheral circuit area has the formation of recharge circuits and Y-switch circuits, and these circuits are connected with a precharge voltage feed line and input/output lines.

In order to reserve between bit lines an area (line b1) for the contact with these lines, five lines (b) are formed in spacings (a) of four bit lines (refer to FIG. 32).

However, in the case of forming a memory cell in the area occupied by one MISFET (refer to FIG. 3 and FIG. 4), i.e., when a memory cell has an area of $4F^2$, the bit line spacing becomes F, and the application of the above-mentioned technique is limited as will be explained in detail in the following.

In the case of forming bit lines of the memory cell forming area by using a Levenson's line-and-space mask, the bit lines are formed in different phases alternately. In forming five lines in the spacings of four bit lines as mentioned above, the five lines need to be formed in different phases alternately, and there will arise restrictions on the line layout.

It is an object of the present invention to provide a layout scheme for the sense amplifier forming area capable of dealing with the microstructured bit lines of memory cells.

Another object of the present invention is to provide a scheme of reducing the sense amplifier forming area.

These and other objects and novel features of the present invention will become apparent from the following description taken in conjunction with the accompanying drawings.

Among the affairs of the present invention disclosed in this specification, representatives are briefed as follows.

In the inventive semiconductor integrated circuit device, first data lines which are formed on a first layer and first lines which are formed on a second layer different from the first layer are connected in a first connecting area between a first memory array area and a sense amplifier area, and second data lines which are formed on the first layer and second lines which are formed on the second layer are connected in a second connecting area between a second memory array area and the sense amplifier area. This layout scheme can reduce the line interval of the first and second lines which are connected to the first and second data lines, respectively.

By forming data transfer lines (IO), precharge lines (VBLR), and power and ground lines (CSN, CSP) on the first layer, these lines can have a relatively large line interval, and consequently it becomes possible to have a connecting section for the connection between the first and second lines formed on the second layer and MISFETs, etc. (elements) formed below the firs, layer.

By forming the data transfer lines (IO) on the second layer, these lines can have a larger thickness and the delay of signals caused by the line resistance can be alleviated. Particularly, by placing a switch area, in which the data transfer lines (IO), etc. are connected, between the first and second memory cell areas and the sense amplifier area, the line layout over the switch area is relaxed and the data transfer lines can be formed here.

Owing to the formation of the first and second lines on the other layer than that of the first and second data lines, the first and second lines can be formed irrespective of the phase relation at the formation of the first and second data lines, and consequently it becomes possible to reduce the line interval of the first and second lines.

DESCRIPTION OF THE PREFERRED EMBODIMENTS

The embodiments of this invention will be explained in detail with reference to the drawings. Through out the figures, items having the same functions are referred to by the common symbols, and explanation thereof are not repeated.

Embodiment 1

Figure 1:
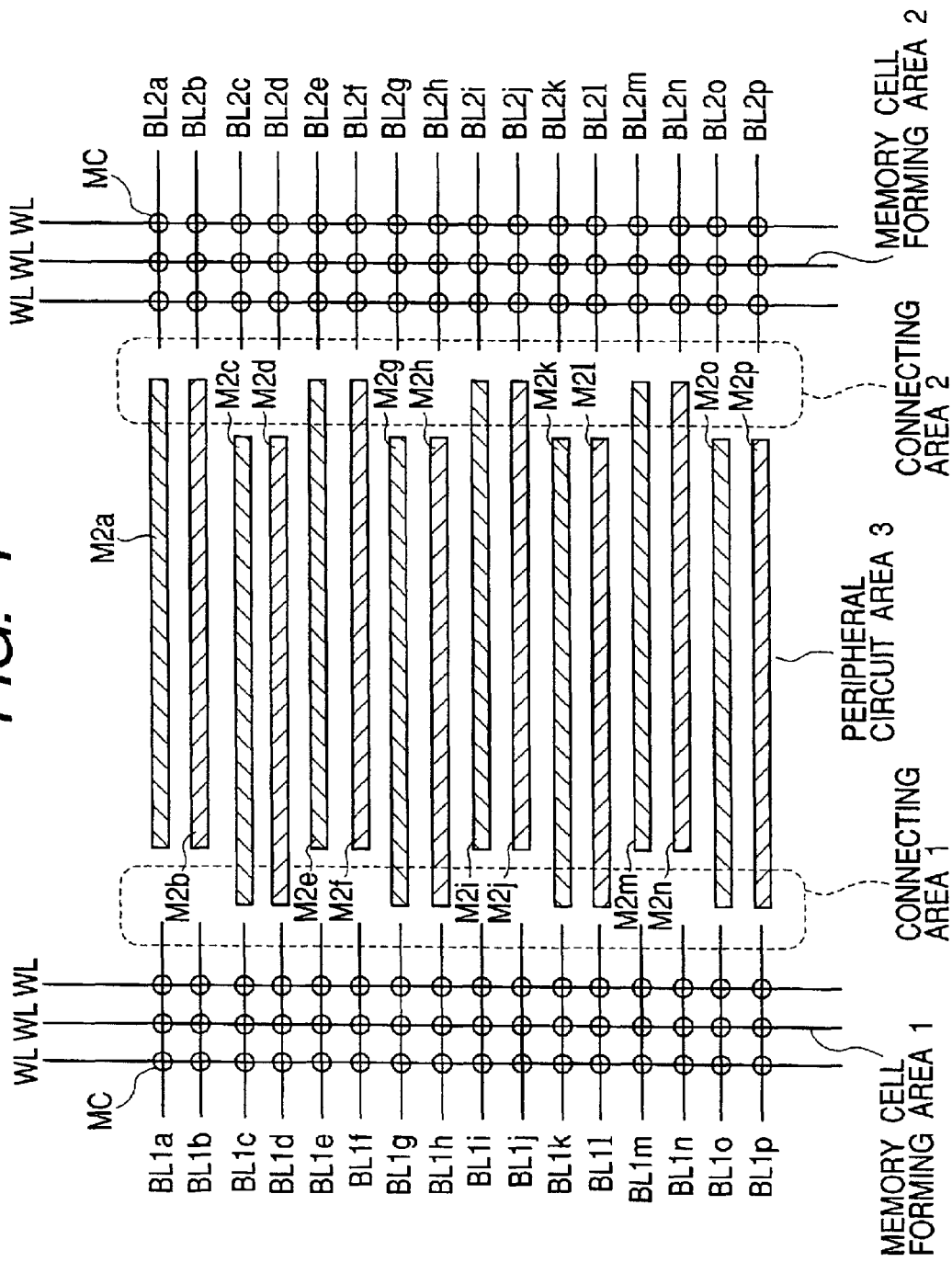
FIG. 1 is a diagram showing in brief the structure of the semiconductor integrated circuit device based on a first embodiment of this invention.

FIG. 1 shows briefly the structure of the DRAM (Dynamic Random Access Memory) of this embodiment. The structure shown includes memory cell forming areas (memory array areas) 1 and 2, which are interposed by a peripheral circuit area 3 in which sense amplifier circuits, etc. are formed. In the memory cell forming areas 1 and 2, there are formed bit lines (data lines) BL1a–BL1p and memory cells MC (indicated by small circles in the figure) located in matrix alignment at the intersections of the bit lines BL1a–BL1p and word lines WL.

Figure 2:
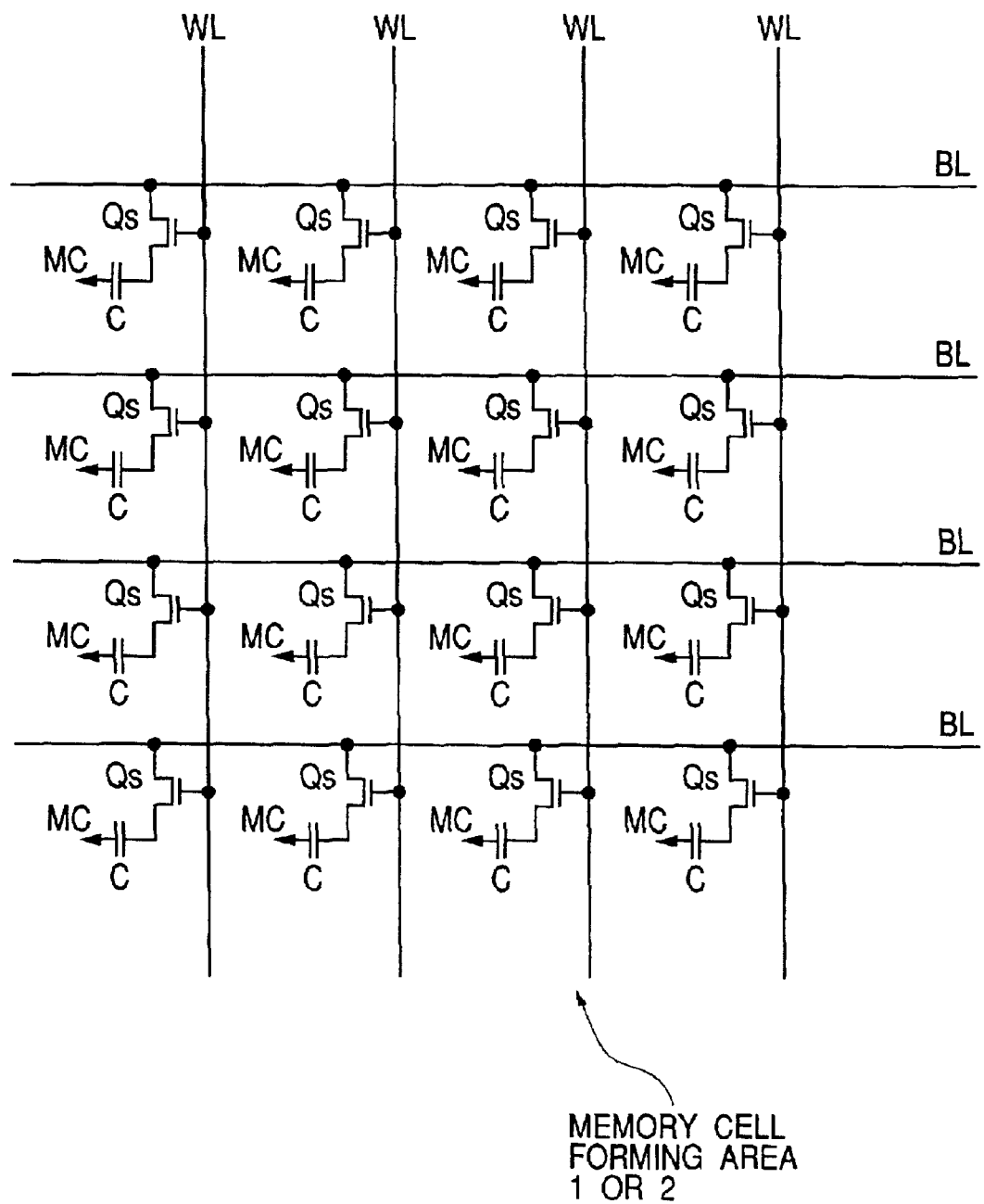
FIG. 2 is a diagram showing the circuit arrangement in the memory cell forming area of the semiconductor integrated circuit device of the first embodiment.

Each memory cell MC is made up of a vertical MISFET Qs for data transfer and a capacitor C, which are connected in series between a bit line BL (BL1a–BL1p, bit lines BL2a–BL2p etc.) and a ground potential as shown in FIG. 2. The data transfer MISFET Qs has its gate electrode connected to a word line WL.

Figure 3:
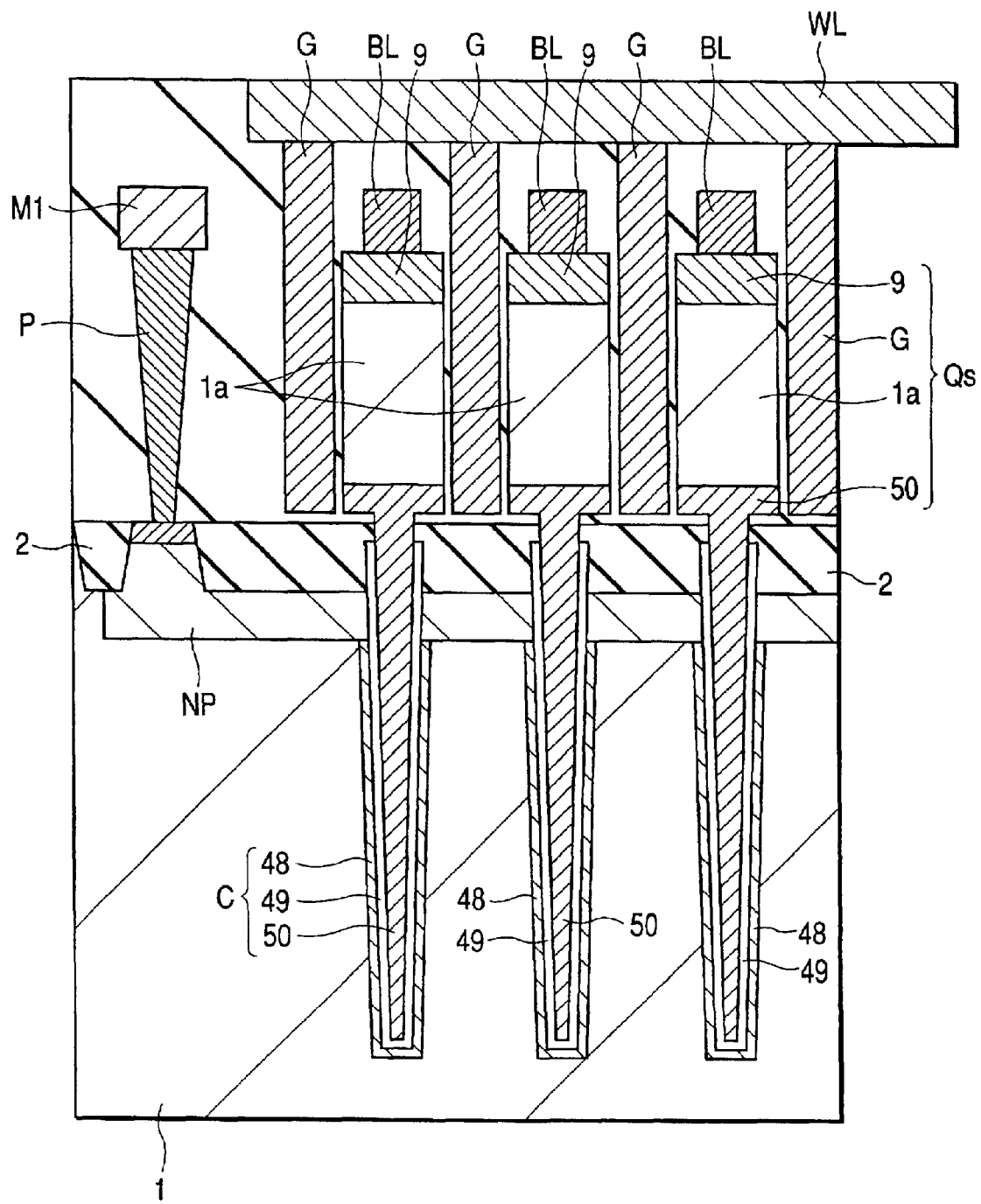
FIG. 3 is a cross-sectional diagram of the substrate, showing the principal portion of the memory cell forming area of the semiconductor integrated circuit device of the first embodiment.
Figure 4:
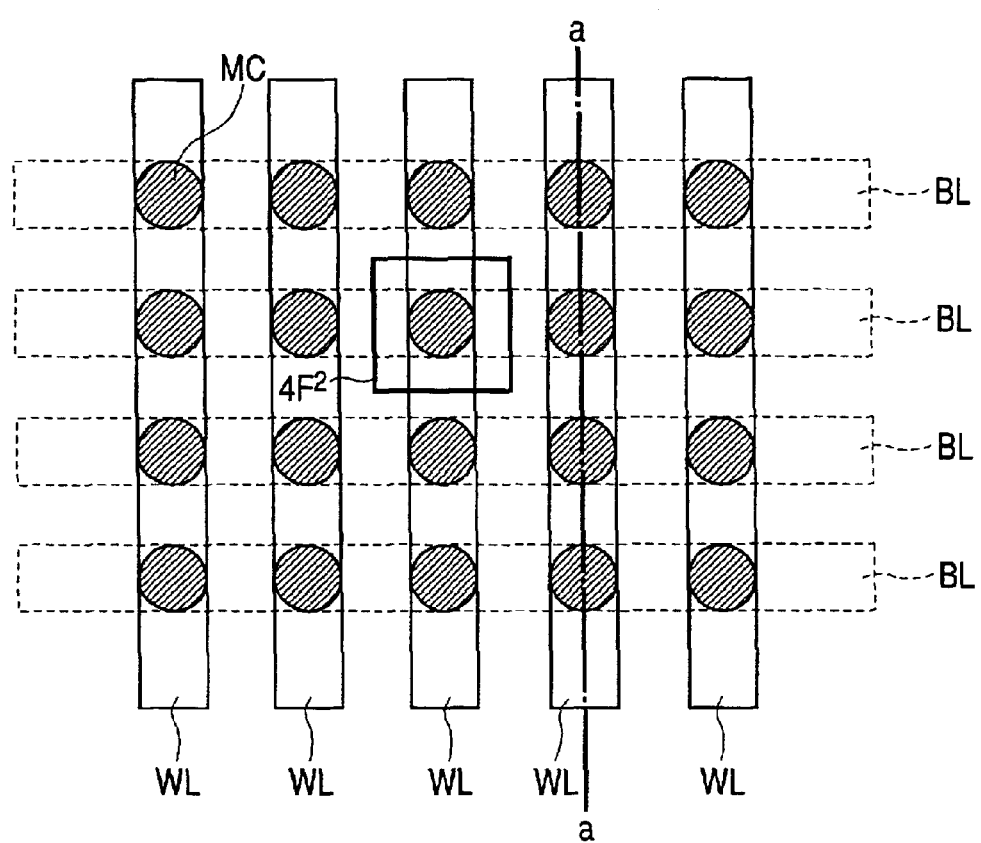
FIG. 4 is a plan view of the substrate, showing the principal portion of the memory cell forming area of the semiconductor integrated circuit device of the first embodiment.

FIG. 3 shows the cross section of the memory cell forming area, and FIG. 4 shows a plan view of the memory cell forming area, with the cross-sectional view of FIG. 3 being taken along the line a—a of FIG. 4. As shown in these figures, each memory cell MC is made up of a data transfer vertical MISFET Qs which is formed on a semiconductor substrate 1 and a capacitor C which is formed in the semiconductor substrate 1 by being connected in series to the MISFET Qs.

The capacitor C has a capacitive insulation film 49 which is formed in a groove of the semiconductor substrate 1, an upper electrode 50 which is a semiconductor member, with impurity being implanted therein, and is buried in the insulation film, and a lower electrode 48 which is formed of an impurity region in the semiconductor substrate 1.

The capacitor C is overlaid by the data transfer vertical MISFET Qs, which has a semiconductor region 1a formed on the upper electrode 50 and a semiconductor member 9, with impurity being implanted therein, formed on the semiconductor region 1a. The semiconductor member 9 and upper electrode 50 become source/drain regions of the vertical MISFET Qs.

Formed on the side wall of the semiconductor region 1a by being interposed by a gate insulation film is a gate electrode G. Accordingly, a channel is formed in the semiconductor region 1a. The gate electrode G is connected to a word line WL. A bit line BL is formed on the semiconductor member 9. The word line WL is formed to run over the bit line BL by being interposed by an interlayer insulation film. The bit line BL and word line WL extend in directions orthogonal to each other as shown in FIG. 4.

Individual memory cells MC are separated by a cell separator 2, and an $n^+$-type plate NP which is connected to the lower electrode 48 is formed in the semiconductor substrate 1. The $n^+$-type plate NP is connected by a plug P to a first-layer line M1.

Based on this structure, it is possible to form a memory cell MC in an area of $4F^2$, with the bit line BL and word line WL having their line width and spacing set equal to the minimum working dimension F.

Figure 5:
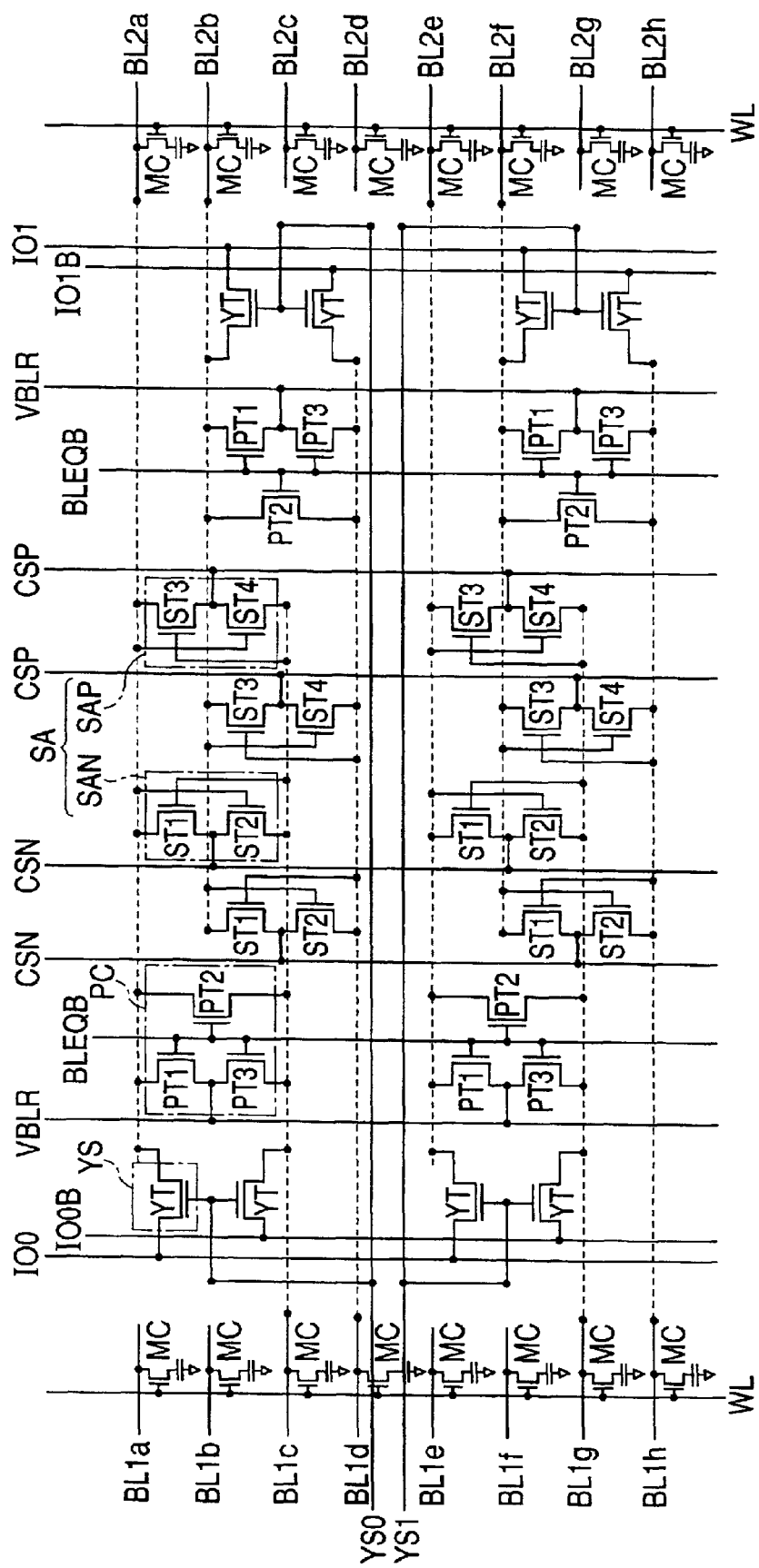
FIG. 5 is a diagram showing the circuit arrangement in the peripheral circuit area of the semiconductor integrated circuit device of the first embodiment.

Next, the peripheral circuit area 3 will be explained. The peripheral circuit area 3 shown in FIG. 1 includes precharge circuits PC, Y-switch circuits YS, and sense amplifier circuits SAN and SAP as shown in FIG. 5. A pair of circuits SAN and SAP complete a sense amplifier circuit SA.

The precharge circuit PC operates to establish a prescribed voltage on bit lines BL prior to the memory cell operation, and it is made up of two MISFETs PT1, PT3 connected in series between bit lines (e.g., BL2a and BL1c) and a MISFET PT2 connected between these bit lines. These MISFETs PT1–PT3 have their gate electrodes connected to a BLEQB line, and the MISFETs PT1, PT3 have their node connected to a VBLR line which is the wiring for feeding the precharge voltage to the bit lines.

The Y-switch circuit (column select circuit) YS is made up of a MISFET YT which is connected between a bit line and an input/output line IO (IO0, IO0B, IO1, IO1B) (e.g., between BL2a and IO0), and it controls the writing of data on the bit line into the memory cell and the readout of data from the memory cell. The MISFET YT has its gate electrode connected to a column select signal line YS (YS0, YS1).

The sense amplifier circuit SA operates to amplify a voltage difference between the bit lines, and it consists of SAN which is made up of two n-channel MISFETs and SAP which is made up of two p-channel MISFETs.

The sense amplifier circuit SA has its two n-channel MISFETs ST1, ST2 connected in series between bit lines (e.g., BL2a and BL1c) and its two p-channel MISFETs ST3, ST4 connected in series between these bit lines. The n-channel MISFET ST1 and p-channel MISFET ST3 have their one ends connected to one bit line (e.g., BL2a) and their gate electrodes connected together by another bit line (e.g., BL1c). The n-channel MISFET ST2 and p-channel MISFET ST4 have their one ends connected to the other bit line (e.g., BL1c) and their gate electrodes connected together by the one bit line (e.g., BL2a). Accordingly, the n-channel MISFETs ST1, ST2 and the p-channel MISFETs ST3, ST4 have their gate electrodes in crisscross connection.

The n-channel MISFETs ST1, ST2 have their node connected to a CSN line, which is a common line (common source line) for driving the sense amplifier SA to the low level. The p-channel MISFETs ST3, ST4 their node connected to a CSP line, which is a common line (common source line) for driving the sense amplifier SA to the high level.

FIG. 6 through FIG. 19 show the circuit layout of the sense amplifier forming area.

Figure 6:
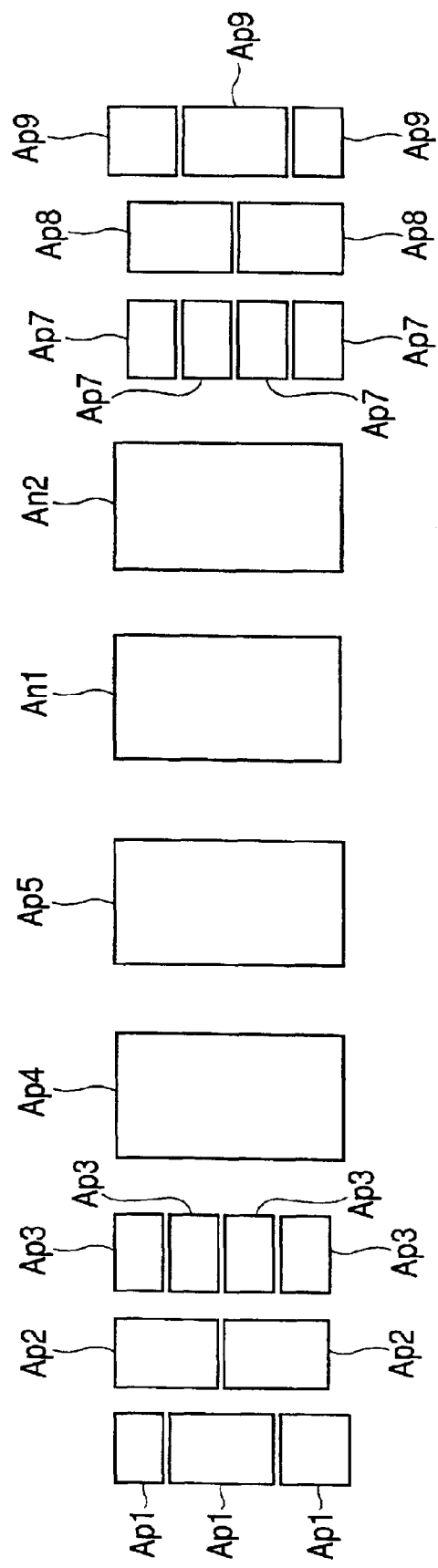
FIG. 6 is a diagram showing the layout of circuits in the peripheral circuit area of the semiconductor integrated circuit device of the first embodiment.

In the sense amplifier forming area shown in FIG. 6, there are placed p-type well regions Ap1 through Ap5, n-type well regions An1 and An2, and p-type well regions Ap7 through Ap9 aligning along the bit lines (lateral direction on the drawing). These p-type and n-type well regions Ap1–Ap5, An1 and An2, and Ap7–Ap9 are surrounded by the cell separator.

Figure 7:
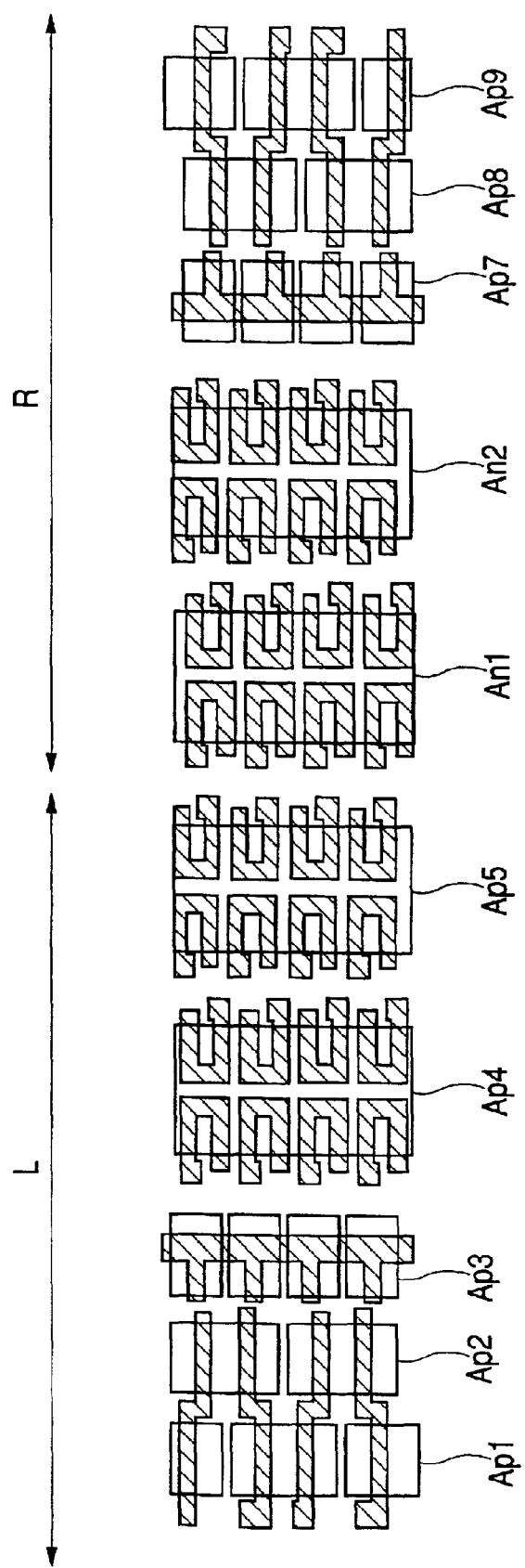
FIG. 7 is a diagram showing the layout of circuits in the peripheral circuit area of the semiconductor integrated circuit device of the first embodiment.
Figure 8:
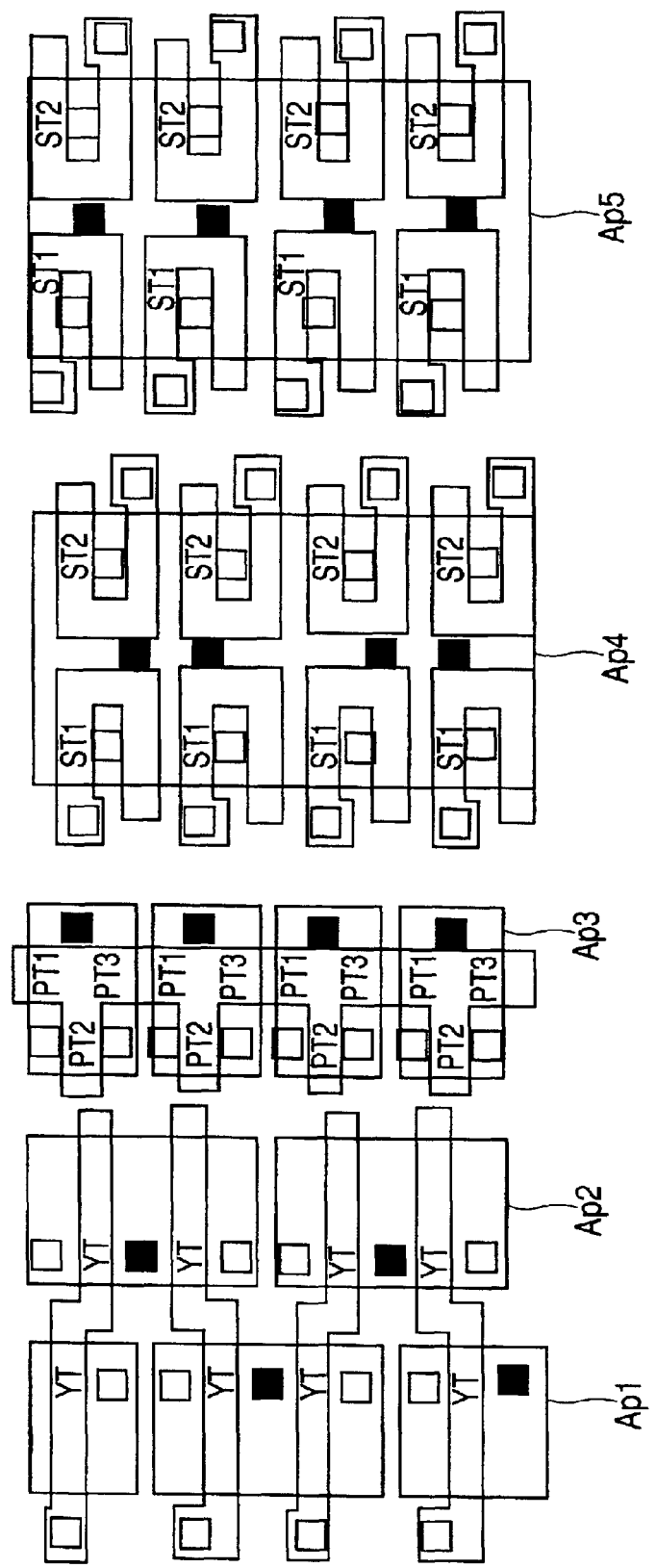
FIG. 8 is a diagram showing the layout of circuits in the peripheral circuit area of the semiconductor integrated circuit device of the first embodiment.
Figure 9:
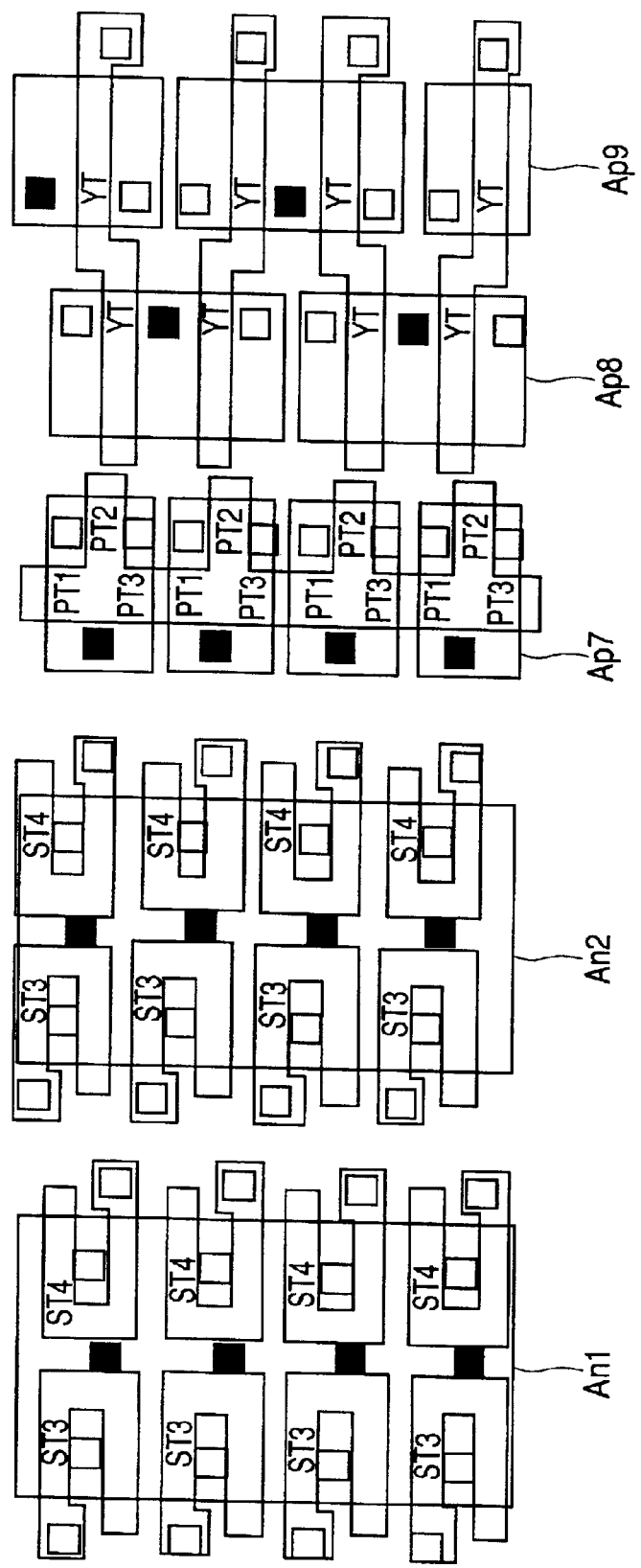
FIG. 9 is a diagram showing the layout of circuits in the peripheral circuit area of the semiconductor integrated circuit device of the first embodiment.

On the main surface of the p-type well regions Ap1, Ap2, Ap8 and Ap9 shown in FIG. 7, FIG. 8 and FIG. 9, there are formed MISFETs YT which constitute the Y-switch circuits YS. On the main surface of the p-type well regions Ap3 and Ap7, there are formed MISFETs PT1, PT2, PT3 which constitute the precharge circuits PC.

On the main surface of the p-type well regions Ap4 and Ap5, there are formed n-channel MISFETs ST1, ST2 (SAN) which constitute the sense amplifier circuits SA. On the main surface of the n-type well regions An1 and An2, there are formed p-channel MISFETs ST3, ST4 (SAP) which constitute the sense amplifier circuits SA.

On the gate electrodes and the source/drain regions of these MISFETs (YT, PT1–PT3, ST1–ST4), there are formed contact sections (shown by small squares in FIG. 8 and FIG. 9).

FIG. 8 and FIG. 9 show the contact sections on the gate electrodes and the source/drain regions of the MISFETs (YT, PT1–PT3, ST1–ST4). FIG. 8 is for the left-half portion (L) of FIG. 7, and FIG. 9 is for the right-half portion (R) of FIG. 7. Among the small squares in FIG. 8 and FIG. 9, solid squares are contact sections for the connection to the first-layer lines M1.

Figure 10:
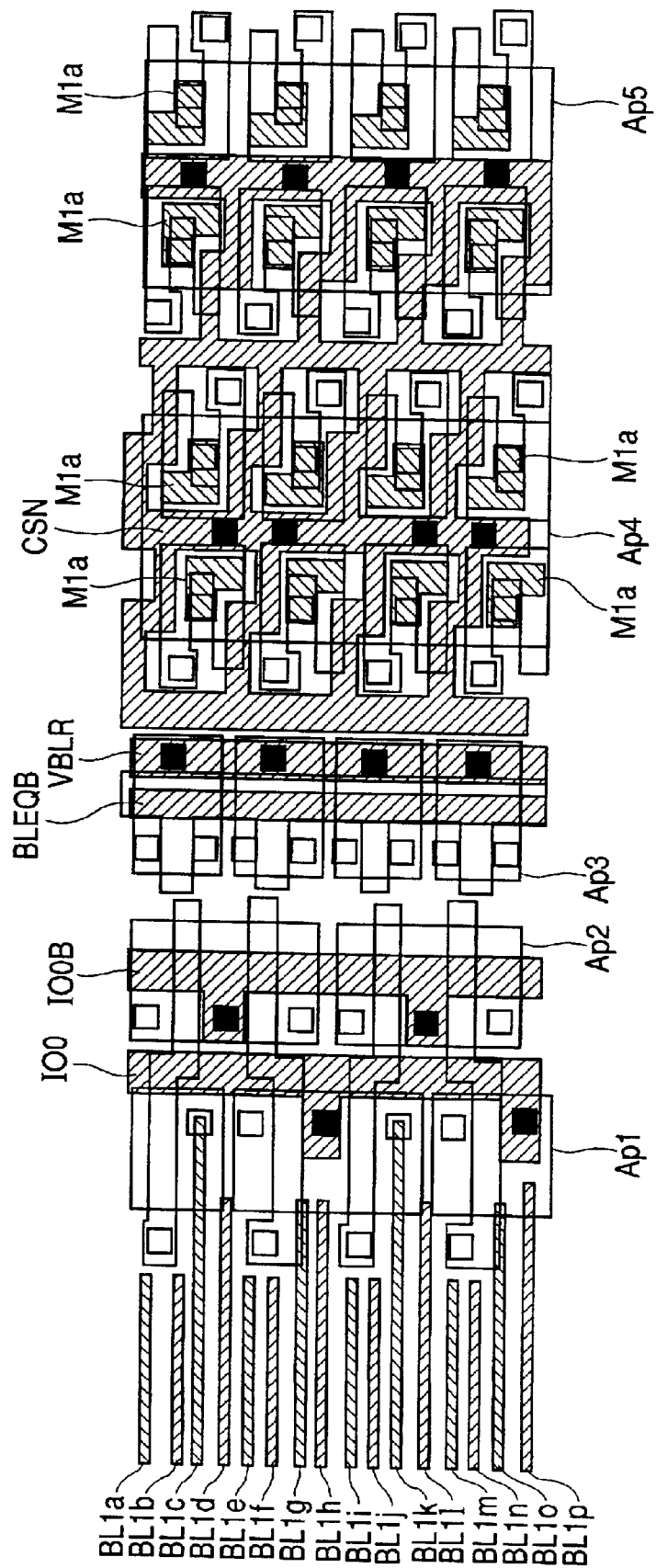
FIG. 10 is a diagram showing the layout of circuits in the peripheral circuit area of the semiconductor integrated circuit device of the first embodiment.
Figure 11:
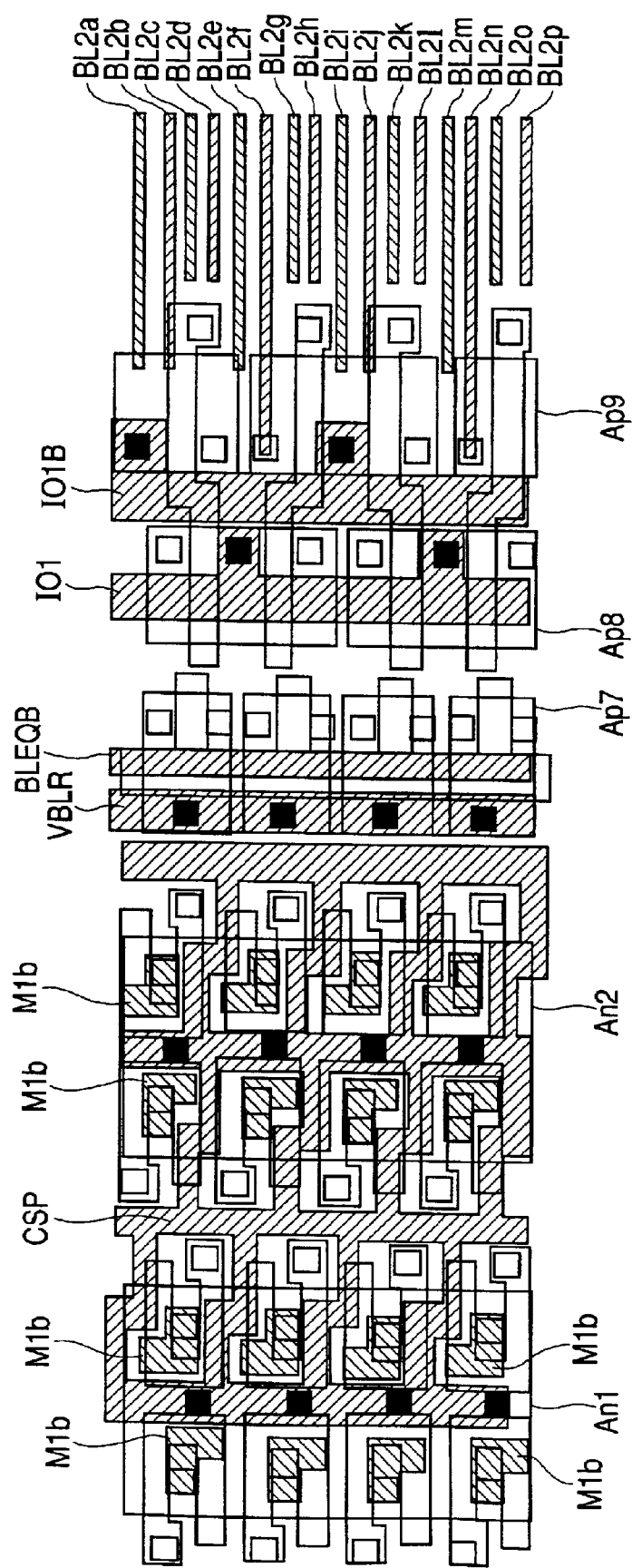
FIG. 11 is a diagram showing the layout of circuits in the peripheral circuit area of the semiconductor integrated circuit device of the first embodiment.

FIG. 10 and FIG. 11 show the circuit layout, with the first-layer lines M1 (IO0, IO0B, BLEQB, VBLR, CSN, CSP, IO1, IO1B) being formed on the contact sections shown in FIG. 8 and FIG. 9. These first-layer lines M1 are made from the same layer as the bit lines (BL1a–BL1p, BL2a–BL2p) over the memory cell forming areas 1 and 2 explained in connection with FIG. 3 and FIG. 4, and the lines M1 extend perpendicularly to the bit lines (vertical direction on the drawing).

As shown in FIG. 10 and FIG. 11, the VBLR line is formed on the nodes of the MISFETs PT1, PT3 of the precharge circuits PC. On the gate electrodes of the MISFETs PT1, PT2, PT3 of the precharge circuits PC, the BLEQB line is formed, and it is connected to the gate electrodes through a region (not shown).

On one source/drain regions of the MISFETs YT of the Y-switch circuits YS, the input/output lines (data transfer lines) IO (IO0, IO0B, IO1, IO1B) are formed.

The CSN line is formed on the common source/drain regions of the n-channel MISFETs ST1, ST2 of the sense amplifier circuits SA, and the CSP line is formed on the common source/drain regions of the p-channel MISFETs ST3, ST4.

A first-layer line M1a is formed on the other source/drain regions of the n-channel MISFETs ST1, ST2 of the sense amplifier circuits SA. Through the line M1a and a second-layer line M2 which will be described later, these source/drain regions are connected to the bit lines. Another first-layer line M1b (conductor section) is formed on the other source/drain regions of the p-channel MISFETs ST3, ST4 of the sense amplifier circuits SA. Through the line M1b and a second-layer line M2 which will be described later, these source/drain regions are connected to the bit lines.

Figure 12:
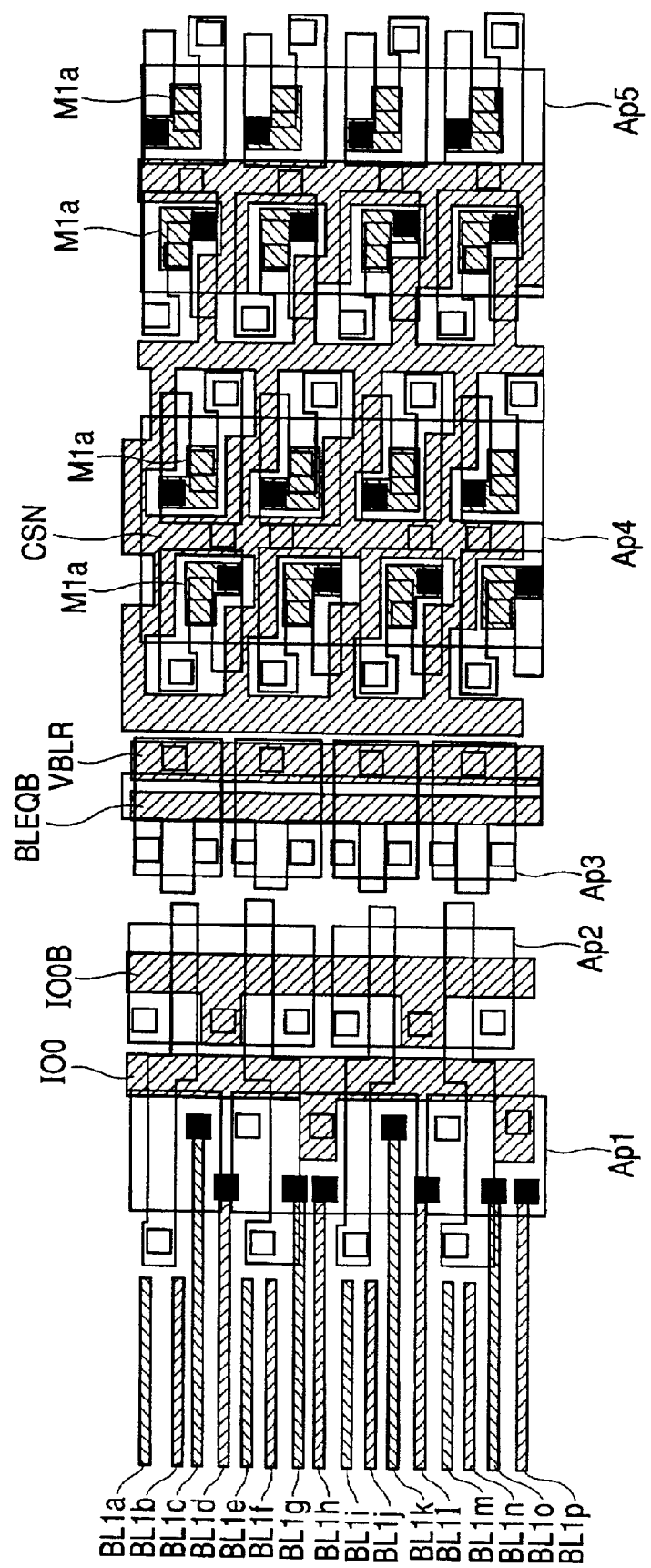
FIG. 12 is a diagram showing the layout of circuits in the peripheral circuit area of the semiconductor integrated circuit device of the first embodiment.
Figure 13:
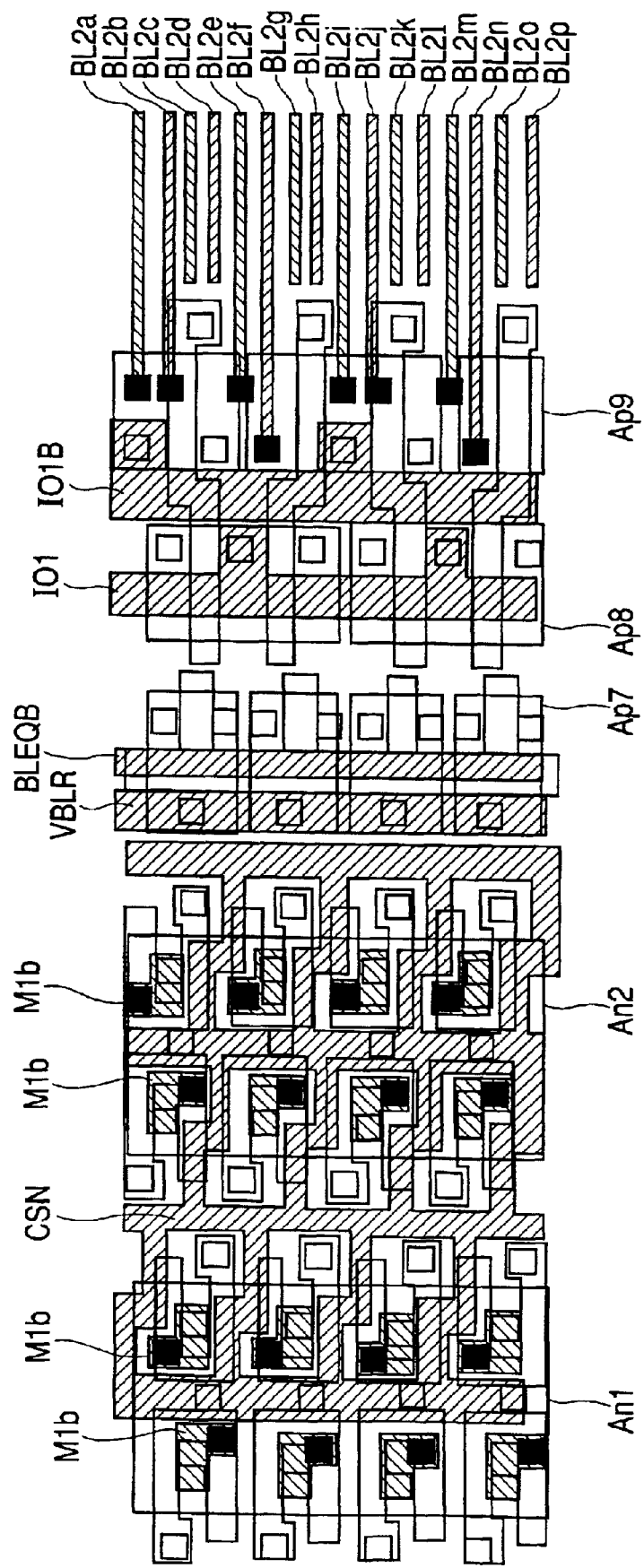
FIG. 13 is a diagram showing the layout of circuits in the peripheral circuit area of the semiconductor integrated circuit device of the first embodiment.

FIG. 12 and FIG. 13 show the first-layer lines M1 (IO0, IO0B, BLEQB, VBLR, CSN, CSP, I01, IO1B) shown in FIG. 10 and FIG. 11 and contact sections (small solid squares) on the bit lines. The second-layer lines M2 (M2a–M2p) are connected to the gate electrodes or source/drain regions of the MISFETs (YT, PT1–PT3 and ST1–ST4) by these contact sections.

Figure 14:
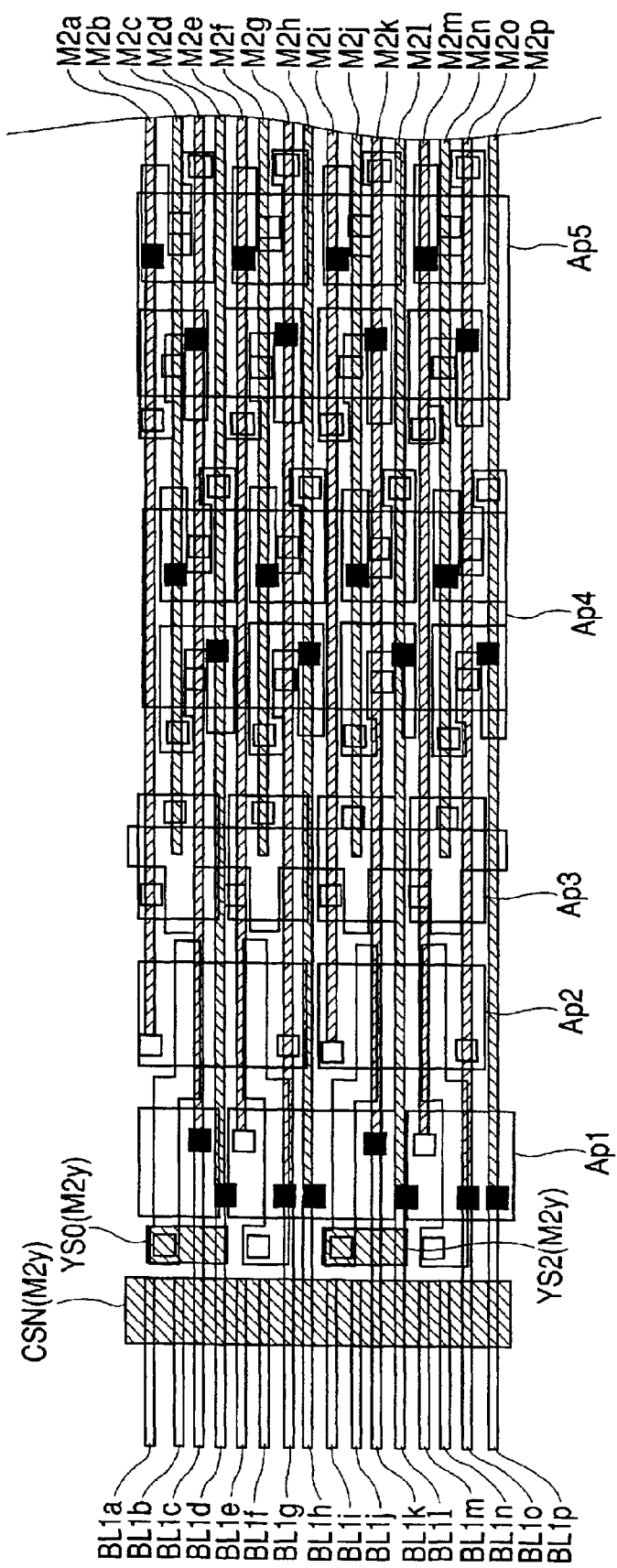
FIG. 14 is a diagram showing the layout of circuits in the peripheral circuit area of the semiconductor integrated circuit device of the first embodiment.
Figure 15:
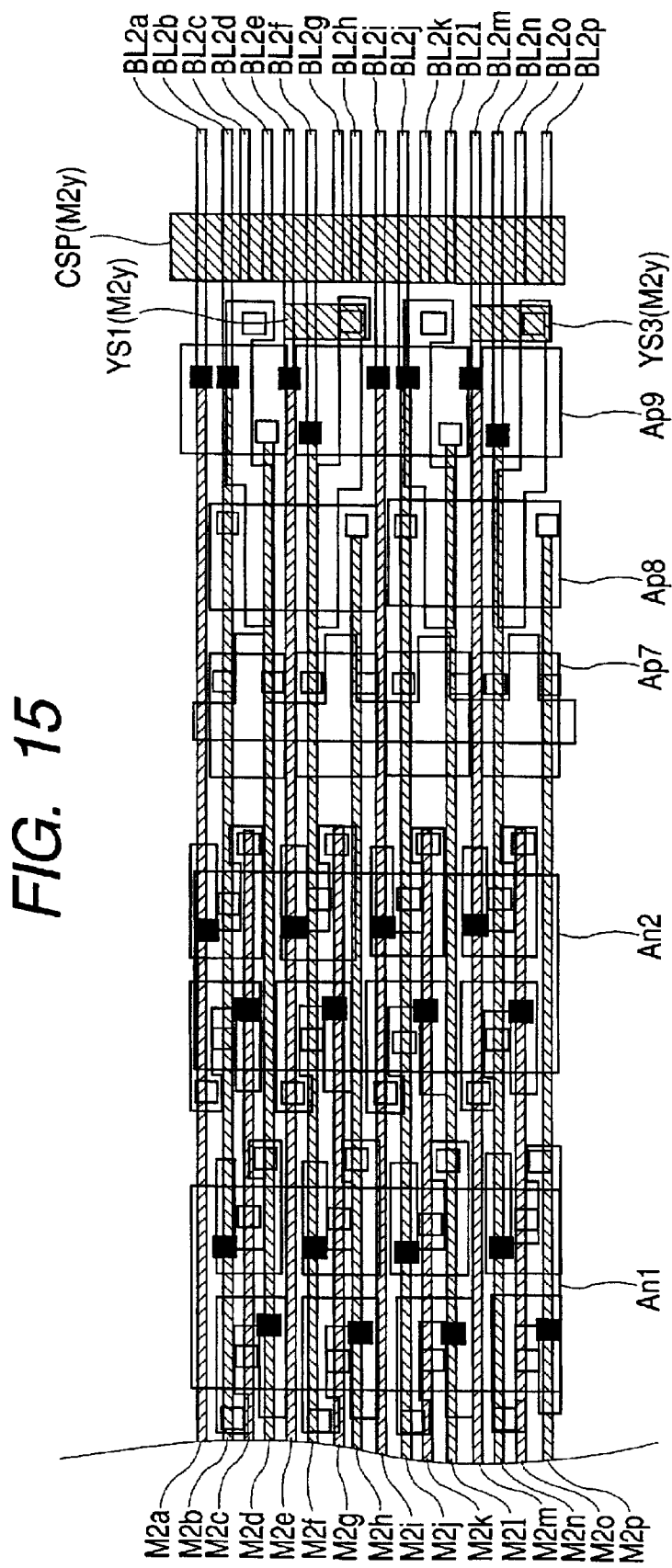
FIG. 15 is a diagram showing the layout of circuits in the peripheral circuit area of the semiconductor integrated circuit device of the first embodiment.

FIG. 14 and FIG. 15 show the circuit layout, with the second-layer lines M2a–M2p, etc. being formed on the contact sections shown in FIG. 12 and FIG. 13. The first-layer lines M1 and associated contact sections are not shown in these figures for the sake of clarification.

The MISFETs ST1 of the precharge circuits PC have their source/drain regions connected between the second-layer lines M2 (e.g., between M2a and M2c) as shown in these figures. The MISFETs YT of the Y-switch circuits YS have their source/drain regions connected to the second-layer lines M2 (e.g., M2a).

The n-channel MISFETs ST2 of the sense amplifier circuits SA have their source/drain regions connected by the first-layer line M1a to the bit lines (e.g., BL2a), which is also connected with the gate electrodes of the MISFETs ST1. The n-channel MISFETs ST1 of the sense amplifier circuits SA have their source/drain regions connected by the first-layer line M1a to the bit lines (e.g., BL1c), which is also connected with the gate electrodes of the MISFETs ST2.

The p-channel MISFETs ST4 of the sense amplifier circuits SA have their source/drain regions connected by the first-layer line M1b to the bit lines (e.g., BL2a), which is also connected with the gate electrodes of the MISFETs ST3. The p-channel MISFETs ST3 of the sense amplifier circuits SA have their source/drain regions connected by the first-layer line M1b to the bit lines (e.g., BL1c), which is also connected with the gate electrodes of the MISFETs ST4.

The second-layer lines M2c, M2d, M2g, M2h, M2k, M2l, M2o and M2p are connected to the bit lines BL2c, BL2d, BL1g, BL1h, BL2k, BL2l, BL1o and BL1p, respectively, in the nearby portions (first connecting areas) of the p-type well region Ap1 (refer to FIG. 12). These second-layer lines and bit lines are connected by contact sections (small solid squares) in the nearby portions (first connecting areas) of the p-type well region Ap1 in FIG. 12.

The second-layer lines M2a, M2b, M2e, M2f, M2i, M2j, M2m and M2n are connected to the bit lines BL2a, BL2b, BL1e, BL2f, BL2i, BL2j, BL2m and BL2n, respectively, in the nearby portions (second connecting areas) of the p-type well region Ap9 (refer to FIG. 13). These second-layer lines and bit lines are connected by contact sections in the nearby portions (second connecting areas) of the p-type well region Ap9 in FIG. 13.

Based on the connection of the sense amplifier circuits SA, precharge circuits PC and Y-switch circuits YS to the bit lines BL through the second-layer lines M2A–M2p in this embodiment, it is possible to reduce the interval of second-layer lines M2.

Particularly, the second-layer line M2 can be formed in a room of the minimum working dimension F, and even in case the bit lines BL and word lines WL have their width and spacing set equal to the minimum working dimension F as shown in FIG. 3 and FIG. 4, the sense amplifier circuits, etc. can be laid out without the need of a large peripheral circuit area.

Furthermore, in this embodiment, first-layer lines M1 are allotted to the signal lines (IO0, IO0B, BLEQB, VBLR, CSN, CSP, I01, IO1B) for driving the peripheral circuits include the sense amplifier circuits. The large interval of these signal lines readily provides contact areas for the connection between the second-layer lines M2 and the source/drain regions or gate electrodes of the MISFETs (YT, PT1–PT3, ST1–ST4) of the peripheral circuits (sense amplifier circuits SA, precharge circuits PC and Y-switch circuits YS).

Formation of the lines M2a–M2p on a layer (second layer) different from the layer (first layer) of the bit lines enables the second-layer lines M2a–M2p to be formed irrespective of the phase of bit lines. In the case of forming bit lines BL of memory cell forming areas by using a Levenson's line-and-space mask, the bit lines are formed in different phases alternately. Accordingly, in the case of forming the lines of the sense amplifier forming area on the same layer (first layer) as the bit lines of the memory cell forming area, the bit lines and the lines of the sense amplifier forming area of the same phase must be connected. A resulting restriction of line layout is that a bit line and an adjacent line in the sense amplifier forming area cannot be connected.

Whereas, according to the present invention, the bit lines and the lines M2a–M2p are formed on different layers (first and seconds layers) thereby to prevent the above-mentioned impropriety.

Based on the divisional layout of the precharge circuits PC and Y-switch circuits YS on both sides of the peripheral circuit area, according to this embodiment, a second-layer line pair (e.g., M2b and M2d) in connection with a bit line pair (e.g., BL2b and BL1d) are connected to one of the precharge circuit and Y-switch circuit YS located on both sides of the peripheral circuit area. In consequence, it is sufficient for one line of the second-layer line pair to extend only up to the middle of the sense amplifier forming area, leaving the areas above the precharge circuits and Y-switch circuits unused for connection for second-layer lines (M2x) other than the M2a–M2p which are connected with the bit lines.

Figure 16:
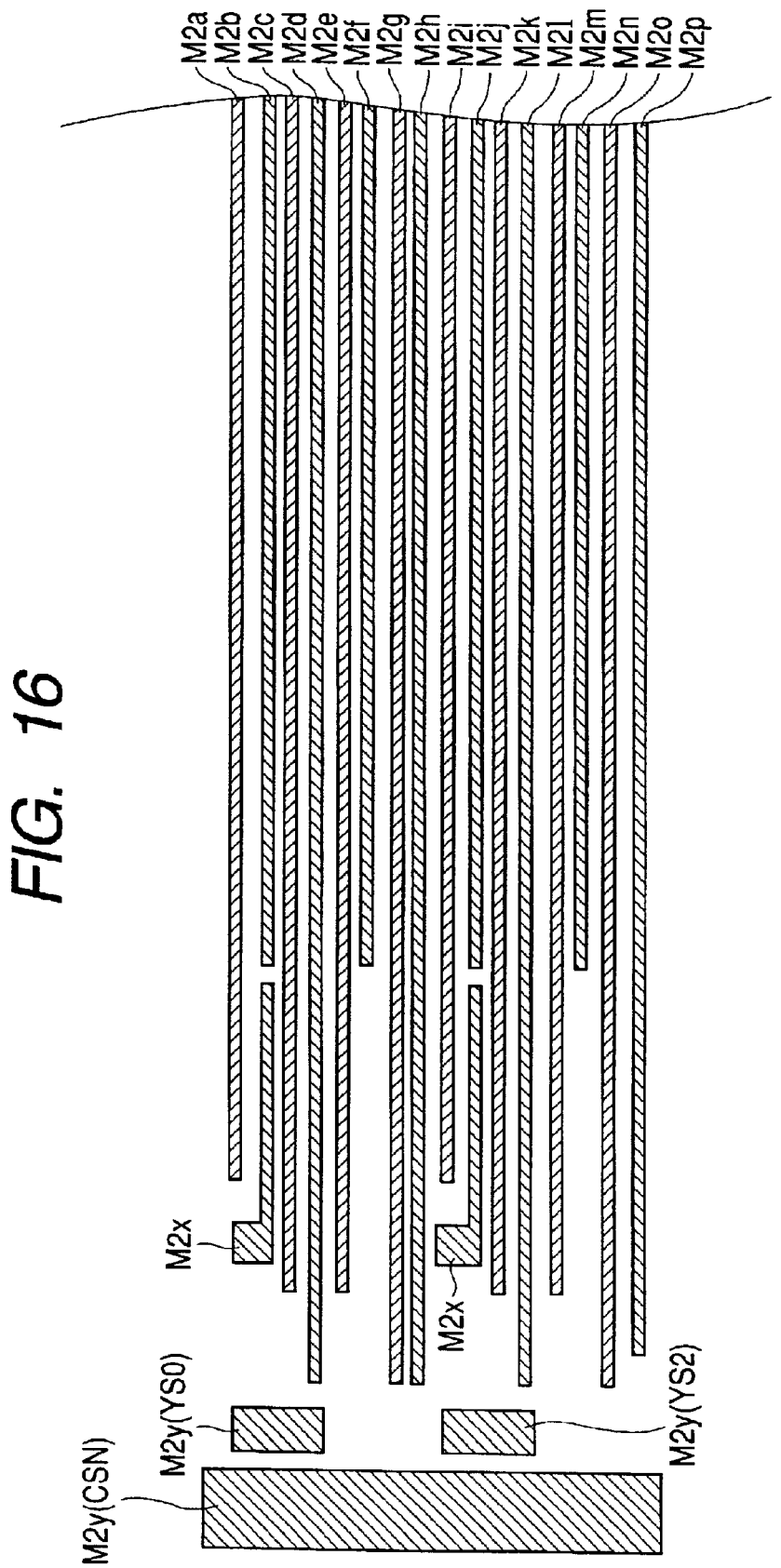
FIG. 16 is a diagram showing the layout of circuits in the peripheral circuit area of the semiconductor integrated circuit device of the first embodiment.
Figure 17:
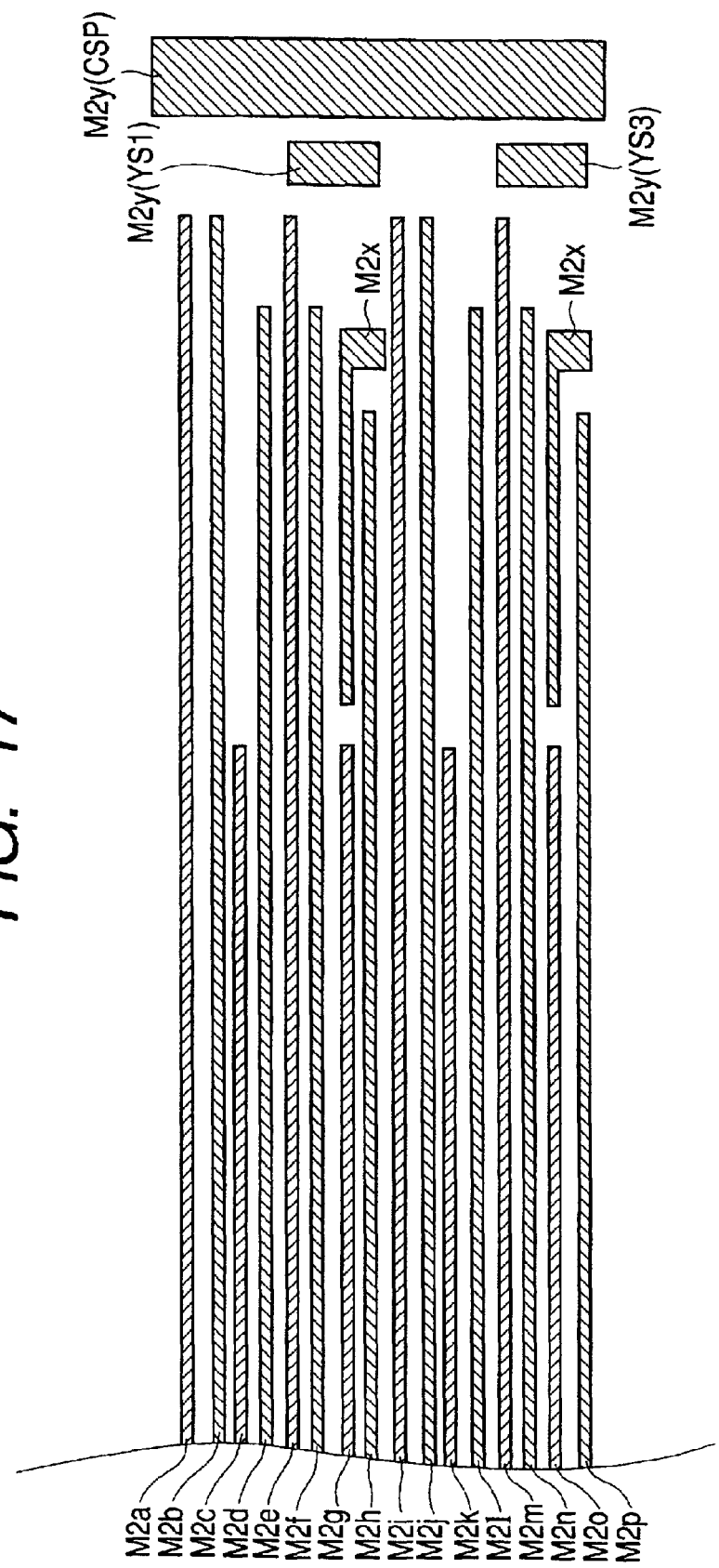
FIG. 17 is a diagram showing the layout of circuits in the peripheral circuit area of the semiconductor integrated circuit device of the first embodiment.

FIG. 16 and FIG. 17 show the second-layer lines M2a–M2p in connection with the bit lines and the other lines M2x.

Although these second-layer lines M2a–M2p and M2x are shown to extend along the bit lines (lateral direction on the drawing), there are other second-layer lines M2y formed perpendicularly to the bit lines. These lines are conductor sections which are connected with the first-layer lines M1 (CSN, CPS) and third-layer lines M3 (YS0, YS1, YS2, YS3) which will be explained next.

Figure 18:
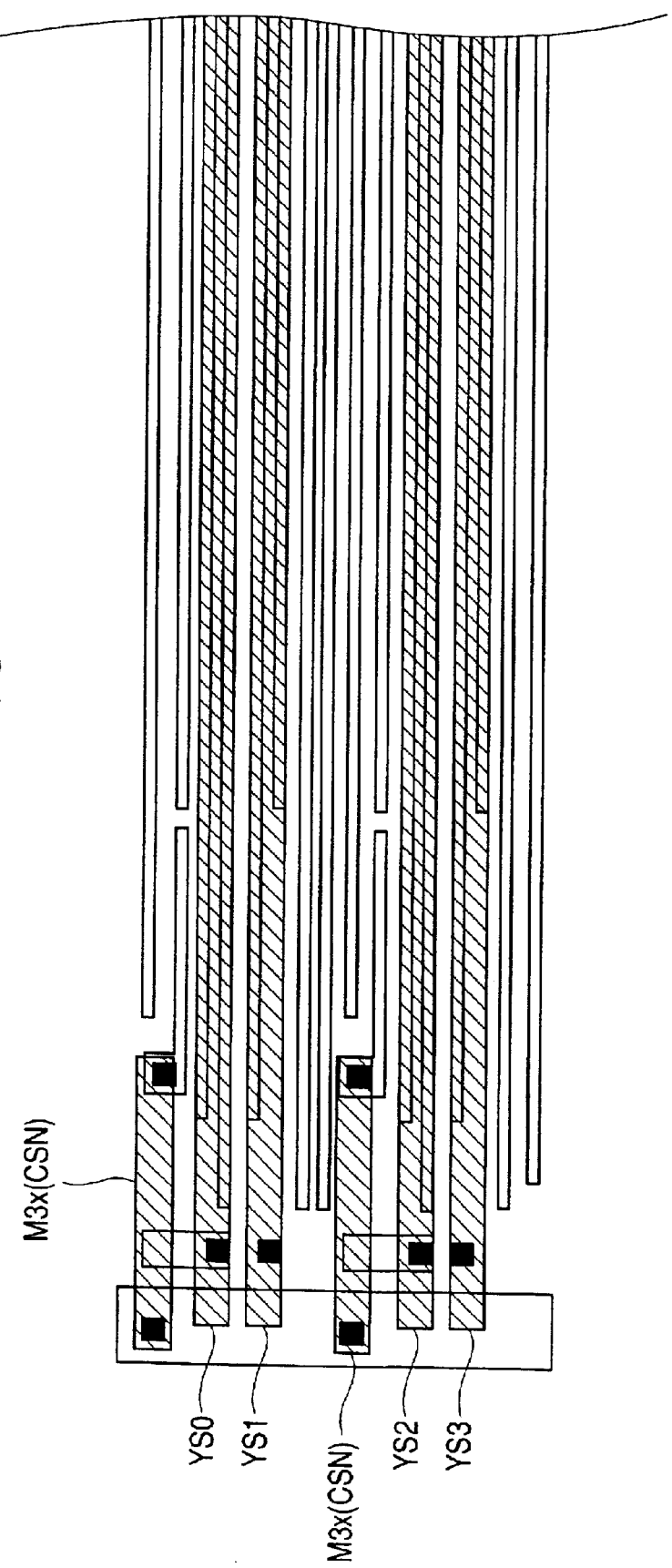
FIG. 18 is a diagram showing the layout of circuits in the peripheral circuit area of the semiconductor integrated circuit device of the first embodiment.
Figure 19:
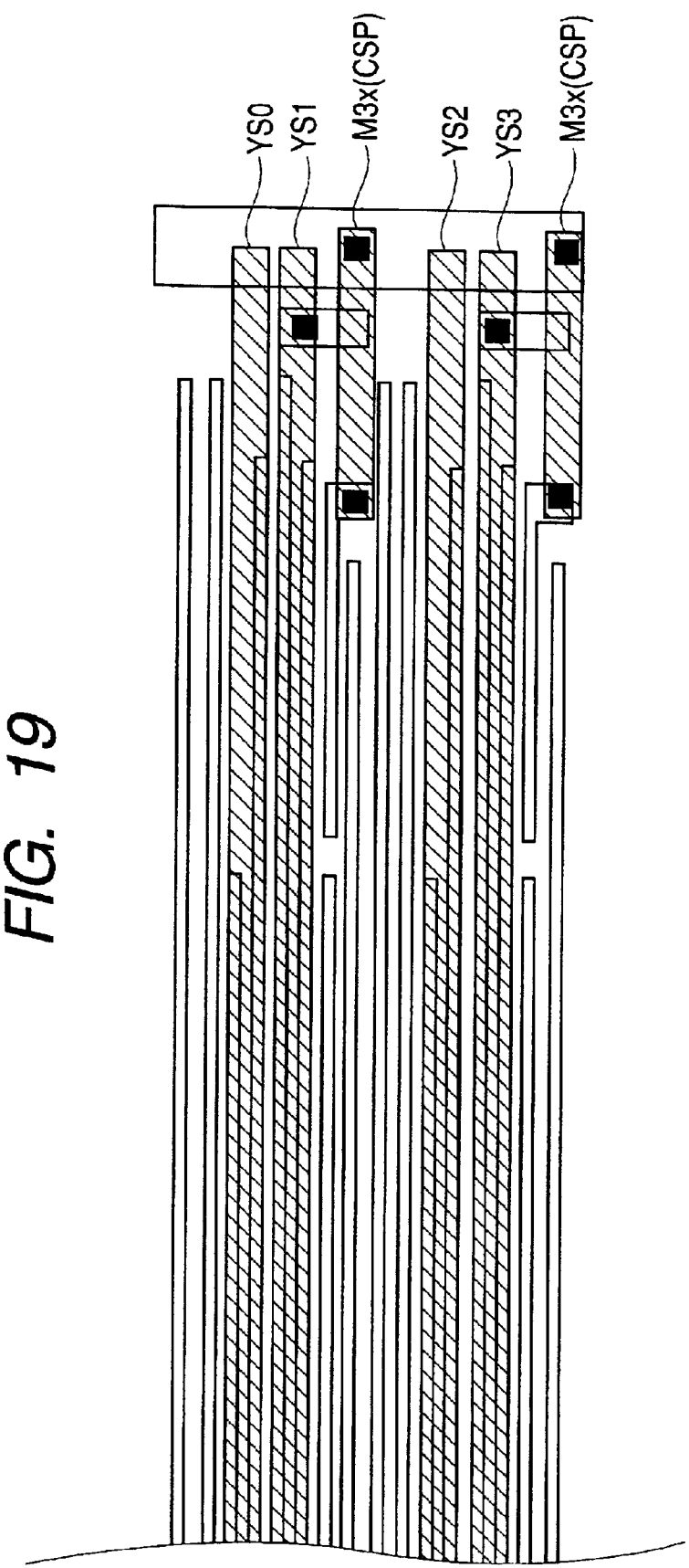
FIG. 19 is a diagram showing the layout of circuits in the peripheral circuit area of the semiconductor integrated circuit device of the first embodiment.

FIG. 18 and FIG. 19 show the circuit layout, with the third-layer lines M3 (YS0–YS3, etc.) being formed over the second-layer lines (M2a–M2p, M2x, etc.) shown in FIG. 16 and FIG. 17. The third-layer lines M3 extend in the same direction as the second-layer lines (M2a, etc.) as shown in these figures. Among the third-layer lines, the YS0–YS3 (column select signal lines) are connected to the gate electrodes of the n-channel MISFETs YT of the Y-switch circuits YS. Among the first-layer line M1, the CSN and CSP lines are connected to the third-layer lines M3x through the second-layer lines.

Embodiment 2

The interchange area (connecting area) provided on both sides (nearby portions of the p-type well regions Ap1 and Ap9) of the peripheral circuit area in the preceding first embodiment may be provided on both sides of the precharge circuits PC, with second-layer lines M2 being allotted to the input/output lines IO (IO0, IO0B, IO1, IO1B). In the following explanation of this embodiment, the circuit arrangement and interconnection of the precharge circuits PC, Y-switch circuits YS and sense amplifier circuits SA, which are identical to the first embodiment described and shown in FIG. 5, will not be explained again.

FIG. 20 through FIG. 31 show the circuit layout of the sense amplifier forming area based on this embodiment.

In the sense amplifier forming area, there are placed p-type well regions Ap1–Ap5, n-type well regions An1 and An2, and p-type well regions Ap7–Ap9 aligning along the bit lines (lateral direction on the drawing) as in the case of the first embodiment. These p-type and n-type well regions Ap1–Ap5, An1 and An2, and Ap7–Ap9 are surrounded by a cell separator.

On the main surface of the p-type well regions Ap1, Ap2, Ap8 and Ap9, there are formed MISFETs YT which constitute the Y-switch circuits YS. On the main surface of the p-type well regions Ap3 and Ap7, there are formed MISFETs PT1, PT2, PT3 which constitute the precharge circuits PC.

On the main surface of the p-type well regions Ap4 and Ap5, there are formed n-channel MISFETs ST1, ST2 (SAN) which constitute the sense amplifier circuits SA. In the n-type well regions An1 and An2, there are formed p-channel MISFETs ST3, ST4 (SAP) which constitute the sense amplifier circuits SA.

Figure 20:
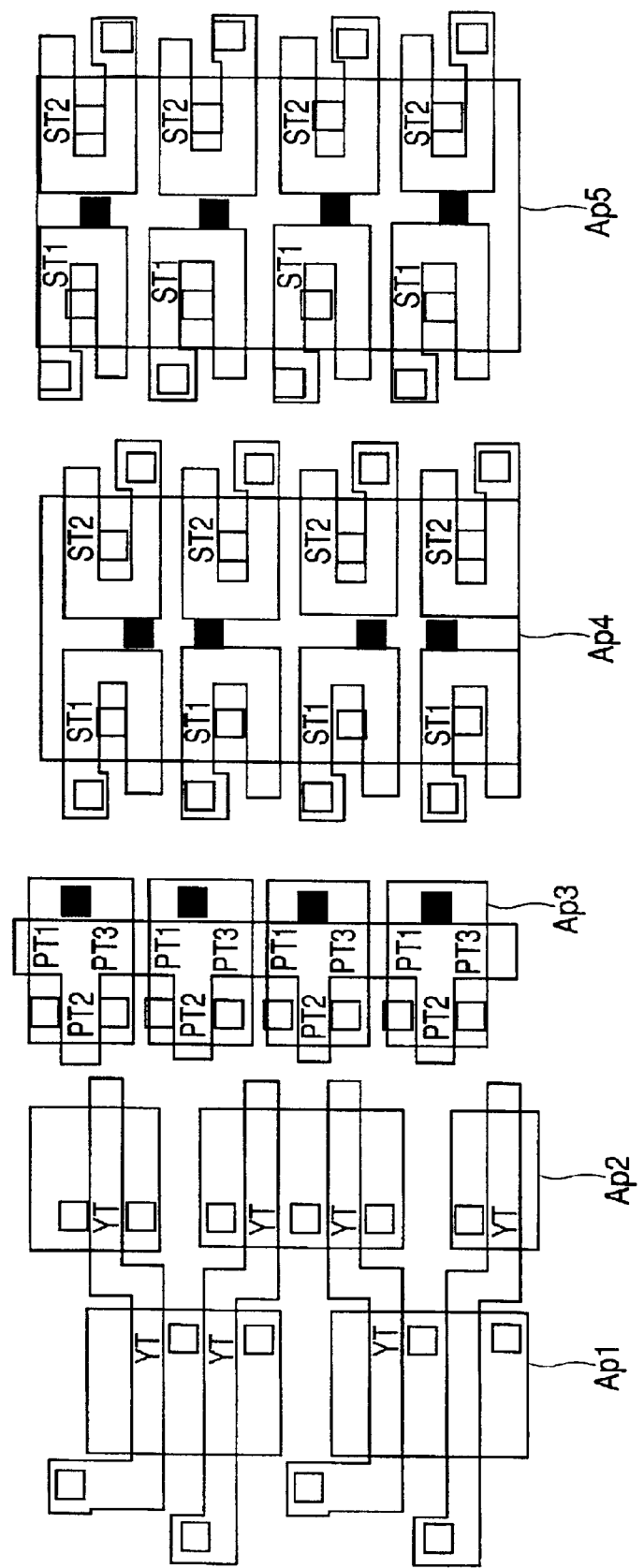
FIG. 20 is a diagram showing the layout of circuits in the peripheral circuit area of the semiconductor integrated circuit device based on a second embodiment of this invention.
Figure 21:
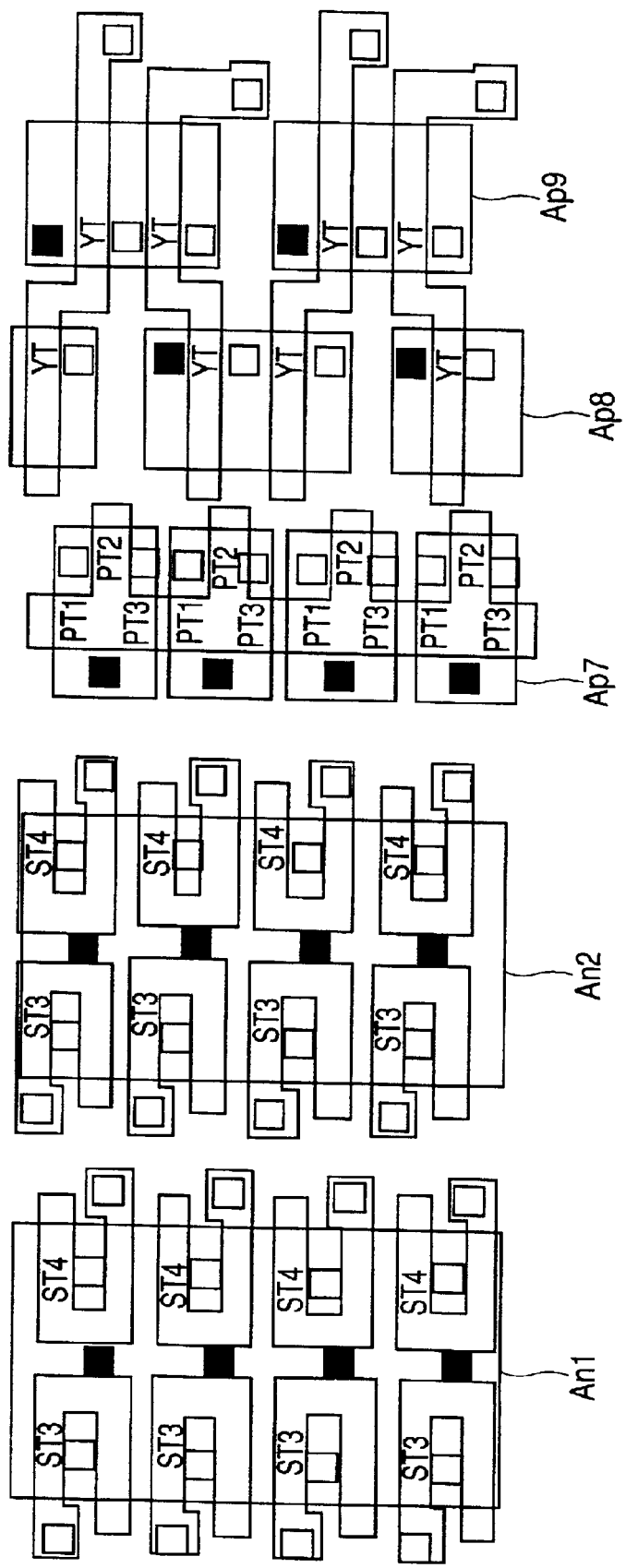
FIG. 21 is a diagram showing the layout of circuits in the peripheral circuit area of the semiconductor integrated circuit device based on a second embodiment of this invention.

On the gate electrodes and the source/drain regions of these MISFETs (YT, PT1–PT3, ST1–ST4), there are formed contact sections (shown by small squares in FIG. 20 and FIG. 21).

FIG. 20 and FIG. 21 show the contact sections on the gate electrodes and the source/drain regions of the MISFETs (YT, PT1–PT3, ST1–ST4). Among the small squares in FIG. 20 and FIG. 21, solid squares are contact sections for the connection to the first-layer lines M1.

Figure 22:
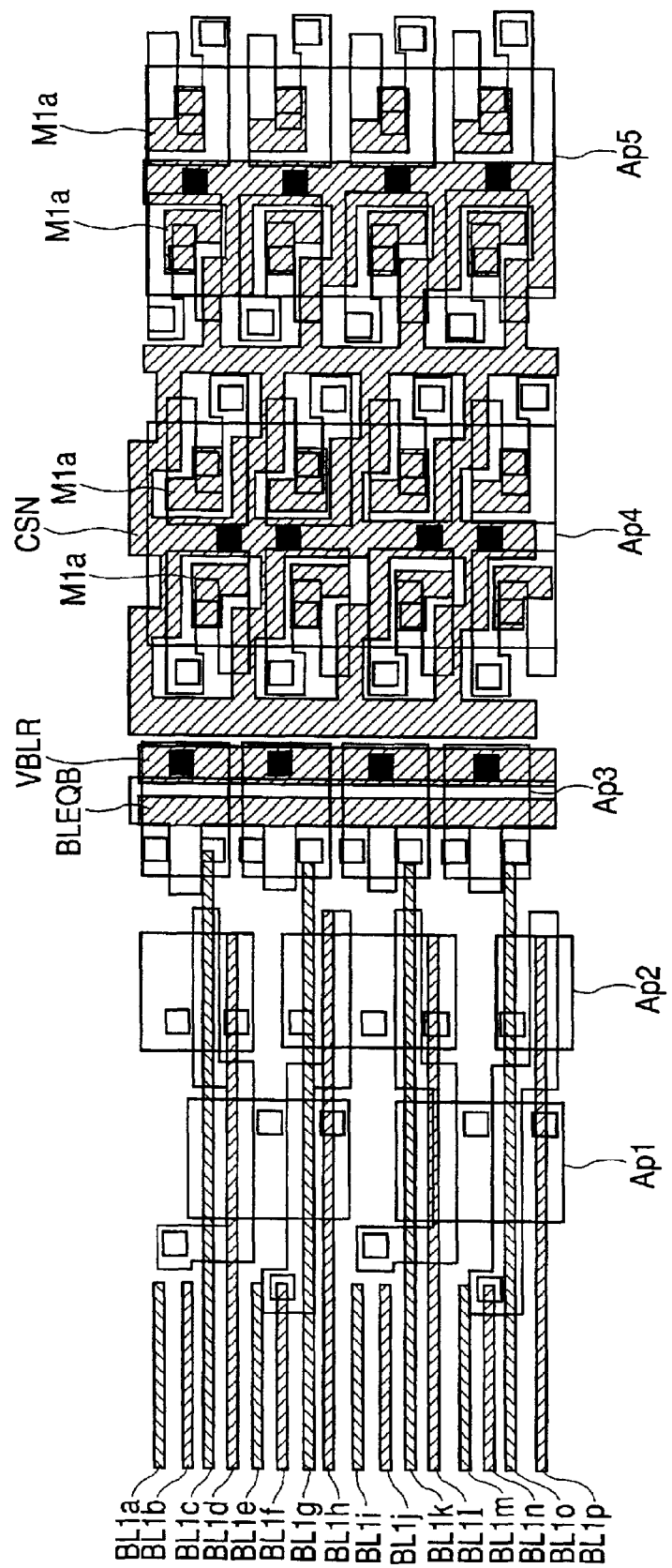
FIG. 22 is a diagram showing the layout of circuits in the peripheral circuit area of the semiconductor integrated circuit device based on a second embodiment of this invention.
Figure 23:
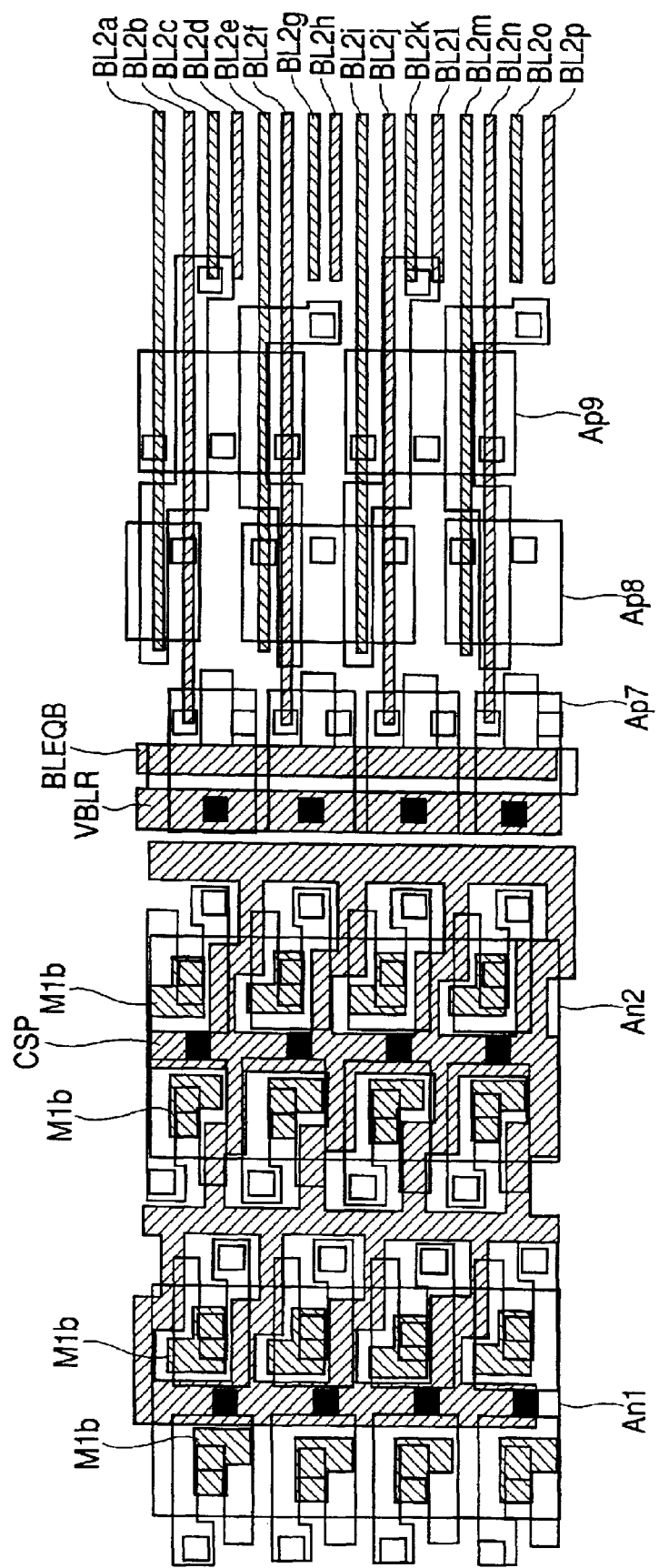
FIG. 23 is a diagram showing the layout of circuits in the peripheral circuit area of the semiconductor integrated circuit device based on a second embodiment of this invention.

FIG. 22 and FIG. 23 show the circuit layout, with first-layer lines M1 (BLEQB, VBLR, CSN, CSP) being formed on the contact sections shown in FIG. 20 and FIG. 21. These first-layer lines M1 are made from the same layer as the bit lines (BL1a–BL1p, BL2a–BL2p) on the memory cell forming areas 1 and 2 explained in connection with FIG. 3 and FIG. 4, and he lines M1 extend perpendicularly to the bit lines (vertical direction on the drawing).

As shown in FIG. 22 and FIG. 23, the VBLR line is formed in the common source/drain regions of the MISFETs PT1, PT3 of the precharge circuits PC. On the gate electrodes of the MISFETs PT1, PT2, PT3 of the precharge circuits PC, the BLEQB line is formed, and it is connected to the gate electrodes through a region (not shown).

The CSN line is formed on the common source/drain regions of the n-channel MISFETs ST1, ST2 of the sense amplifier circuits SA. The CSP line is formed on the common source/drain regions of the p-channel MISFETs ST3, ST4.

On the other source/drain regions of the n-channel MISFETs ST1, ST2 of the sense amplifier circuits SA also, there is formed a first-layer line M1a. The source/drain regions are connected to the bit lines through the line M1a and a second line M2 which will be disposed later. On the other source/drain regions of the n-channel MISFETs ST3, ST4 of the sense amplifier circuits SA also, there is formed a first-layer line M1b (conductor section). The source/drain regions are connected to the bit lines through the line M1b and a second line M2 which will be disposed later.

Figure 24:
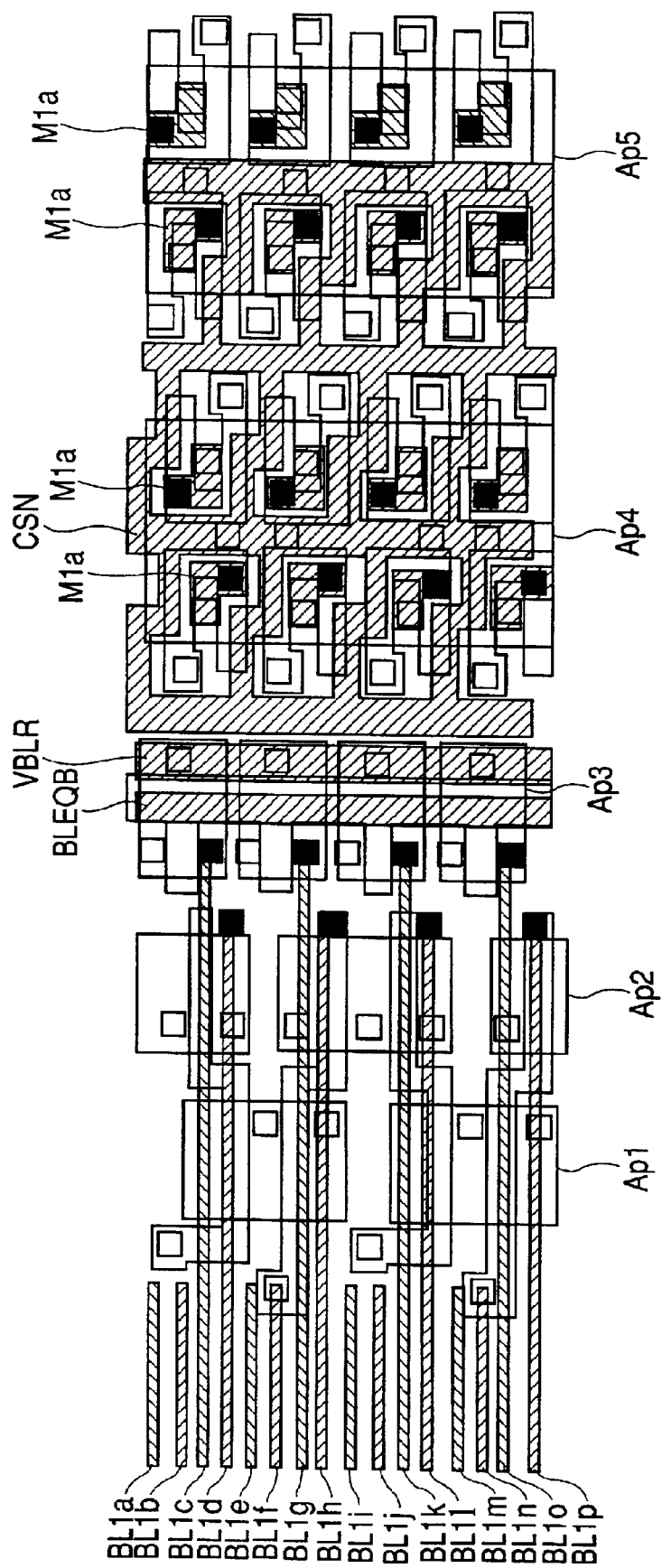
FIG. 24 is a diagram showing the layout of circuits in the peripheral circuit area of the semiconductor integrated circuit device based on a second embodiment of this invention.
Figure 25:
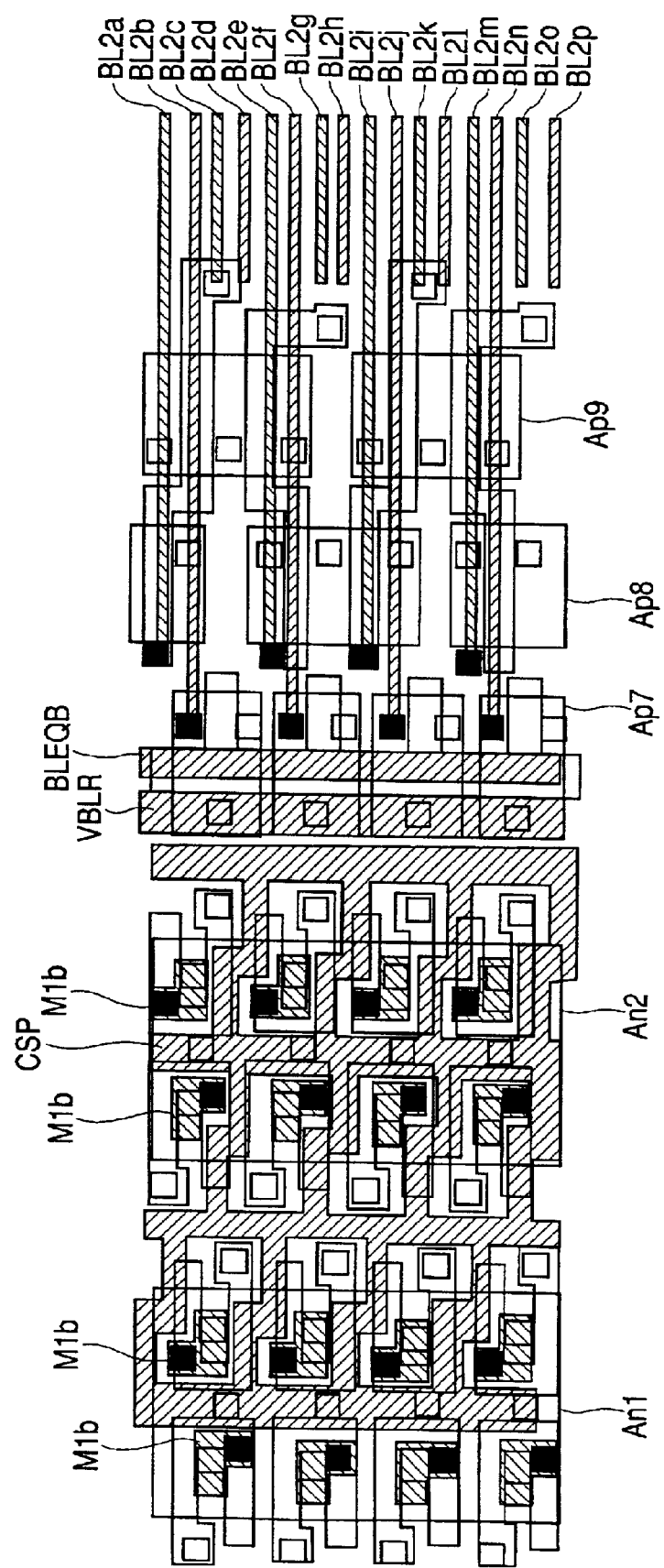
FIG. 25 is a diagram showing the layout of circuits in the peripheral circuit area of the semiconductor integrated circuit device based on a second embodiment of this invention.

FIG. 24 and FIG. 25 show the first-layer lines M1 (BLEQB, VBLR, CSN, CSP) shown in FIG. 22 and FIG. 23 and contact sections (small solid squares) on the bit lines. The second-layer lines M2 (M2a–M2p) are connected to the gate electrodes or source/drain regions of the MISFETs (PT1–PT3, ST1–ST4) by these contact sections.

Figure 26:
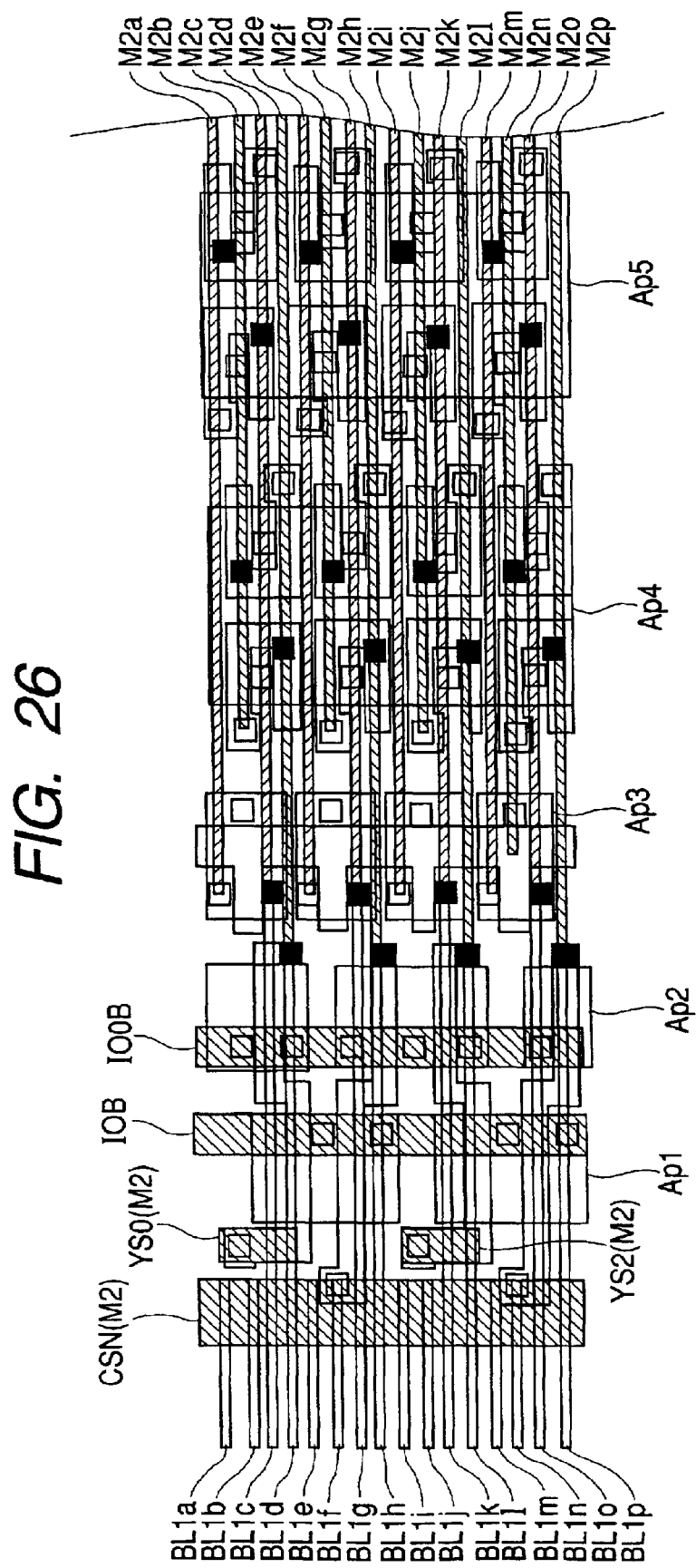
FIG. 26 is a diagram showing the layout of circuits in the peripheral circuit area of the semiconductor integrated circuit device based on a second embodiment of this invention.
Figure 27:
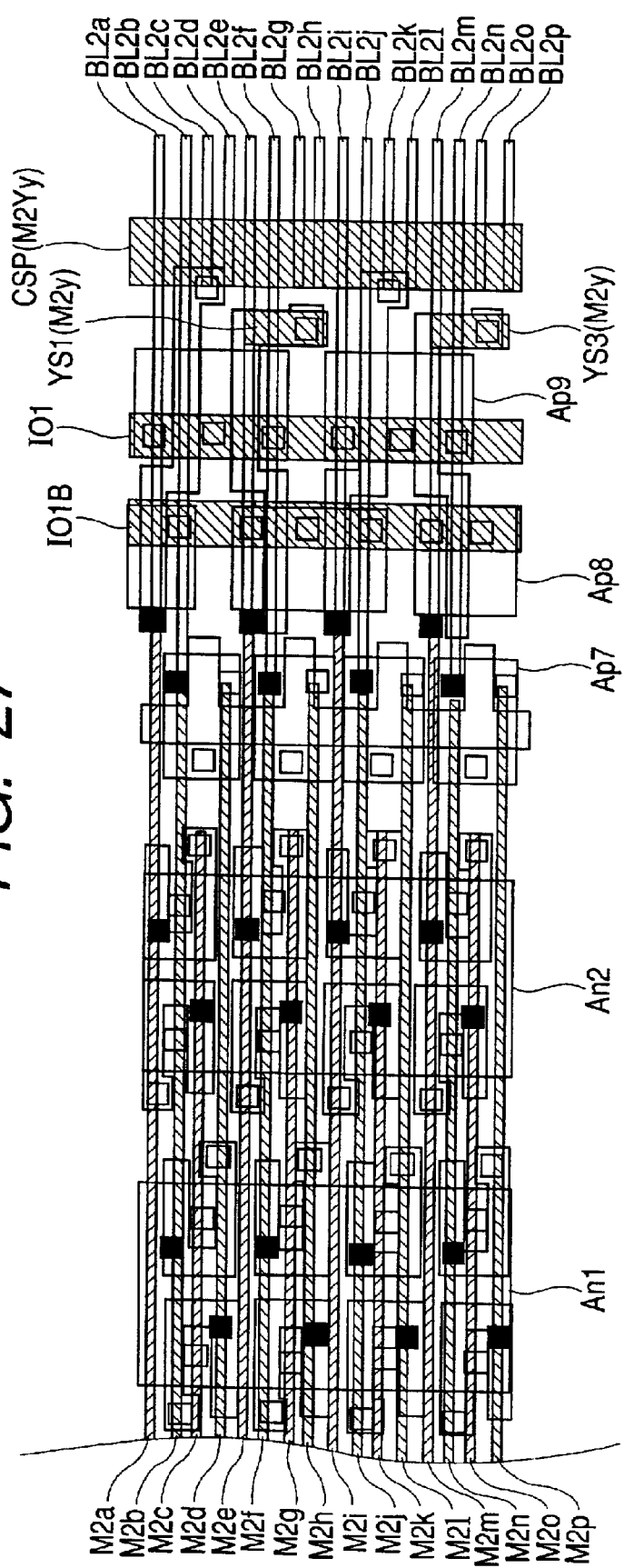
FIG. 27 is a diagram showing the layout of circuits in the peripheral circuit area of the semiconductor integrated circuit device based on a second embodiment of this invention.

FIG. 26 and FIG. 27 show the circuit layout, with the second-layer lines M2a–M2p, etc. being formed on the contact sections shown in FIG. 24 and FIG. 25. The first-layer lines M1 and associated contact sections are not shown in these figures for the sake of clarification.

The MISFETs ST1 of the precharge circuits PC have their source/drain regions connected between the second-layer lines (e.g., between M2a and M2c) as shown in these figures. The MISFETs YT of the Y-switch circuits YS have their source/drain regions connected to the second-layer lines M2 (e.g., M2a).

The n-channel MISFETs ST2 of the sense amplifier circuits SA have their source/drain regions connected by the first-layer line M1a to the bit lines (e.g., BL2a), which is also connected with the gate electrodes of the MISFETs ST1. The n-channel MISFETs ST1 of the sense amplifier circuits SA have their source/drain regions connected by the first-layer line M1a to the bit lines (e.g., BL1c), which is also connected with the gate electrodes of the MISFETs ST2.

The p-channel MISFETs ST4 of the sense amplifier circuits SA have their source/drain regions connected by the first-layer line M1b to the bit lines (e.g., BL2a), which is also connected with the gate electrodes of the MISFETs ST3. The p-channel MISFETs ST3 of the sense amplifier circuits SA have their source/drain regions connected by the first-layer line M1b to the bit lines (e.g., BL1c), which is also connected with the gate electrodes of the MISFETs ST4.

The second-layer lines M2c, M2d, M2g, M2h, M2k, M2l, M2o and M2p are connected to the bit lines BL2c, BL2d, BL1g, BL1h, BL2k, BL2l, BL1o and BL1p, respectively, in the border portions (first connecting areas) of the p-type well regions Ap2 and Ap3 (refer to FIG. 26). These second-layer lines and bit lines are connected by contact sections (small solid squares) in the border portions (first connecting areas) of the p-type well region Ap2 and Ap3 shown in FIG. 26.

The second-layer lines M2a, M2b, M2e, M2f, M2l, M2j, M2m and M2n are connected to the bit lines BL2a, BL2b, BL1e, BL2f, BL2i, BL2j, BL1m and BL2n, respectively, in the border portions (second connecting areas) of the p-type well regions Ap7 and Ap8 (refer to FIG. 27). These second-layer lines and bit lines are connected by contact sections in the border portions (second connecting areas) of the p-type well regions Ap7 and Ap8 (refer to FIG. 27).

On one source/drain regions of the MISFETs YT of the Y-switch circuits YS, there are formed input/output lines IO (IO0, IO0B, IO1, IO1B) as second-layer lines.

Based on the connection of the sense amplifier circuits SA, precharge circuits PC and Y-switch circuits YS to the bit lines BL through the second-layer lines M2a–M2p in this embodiment, the same effectiveness as the first embodiment can be attained.

Based on the layout of the connecting areas for these second-layer lines and bit lines in the border portions (first connecting areas) of the p-type well regions Ap2 and Ap3 or in the border portions (second connecting areas) of the p-type well regions Ap7 and Ap8, it is possible to form the input/output lines IO (IO0, IO0B, IO1, IO1B) as second-layer lines over the Y-switch circuits YS.

In consequence, it is possible for the input/output lines IO to have a smaller resistance. In this respect, the first-layer lines M1 are liable to have a large resistance due to a limited thickness of their conductor material, which can cause the delay of signal transfer and thus deteriorate the operation speed. Whereas, this embodiment is designed to form the input/output lines IO, to which the delay of line is a critical matter of concern, as second-layer lines, thereby overcoming the problem.

Figure 28:
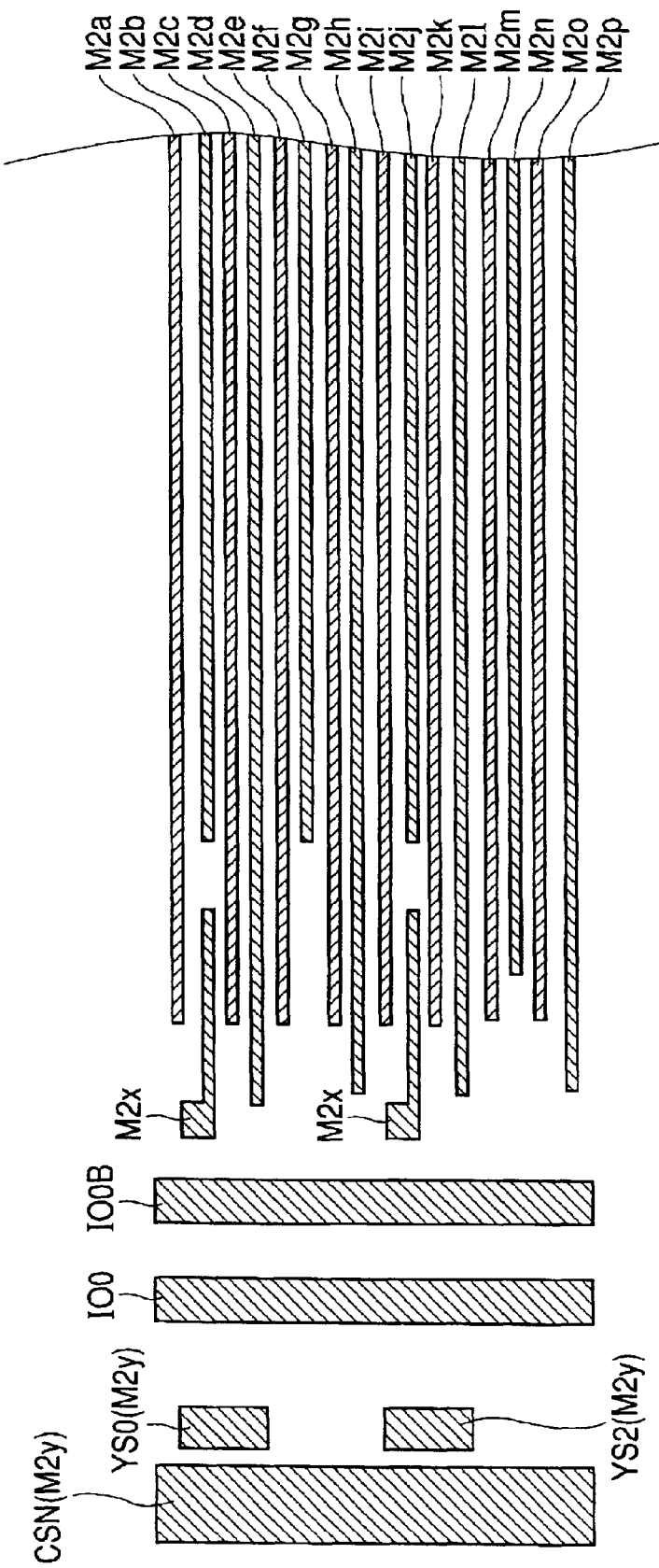
FIG. 28 is a diagram showing the layout of circuits in the peripheral circuit area of the semiconductor integrated circuit device based on a second embodiment of this invention.
Figure 29:
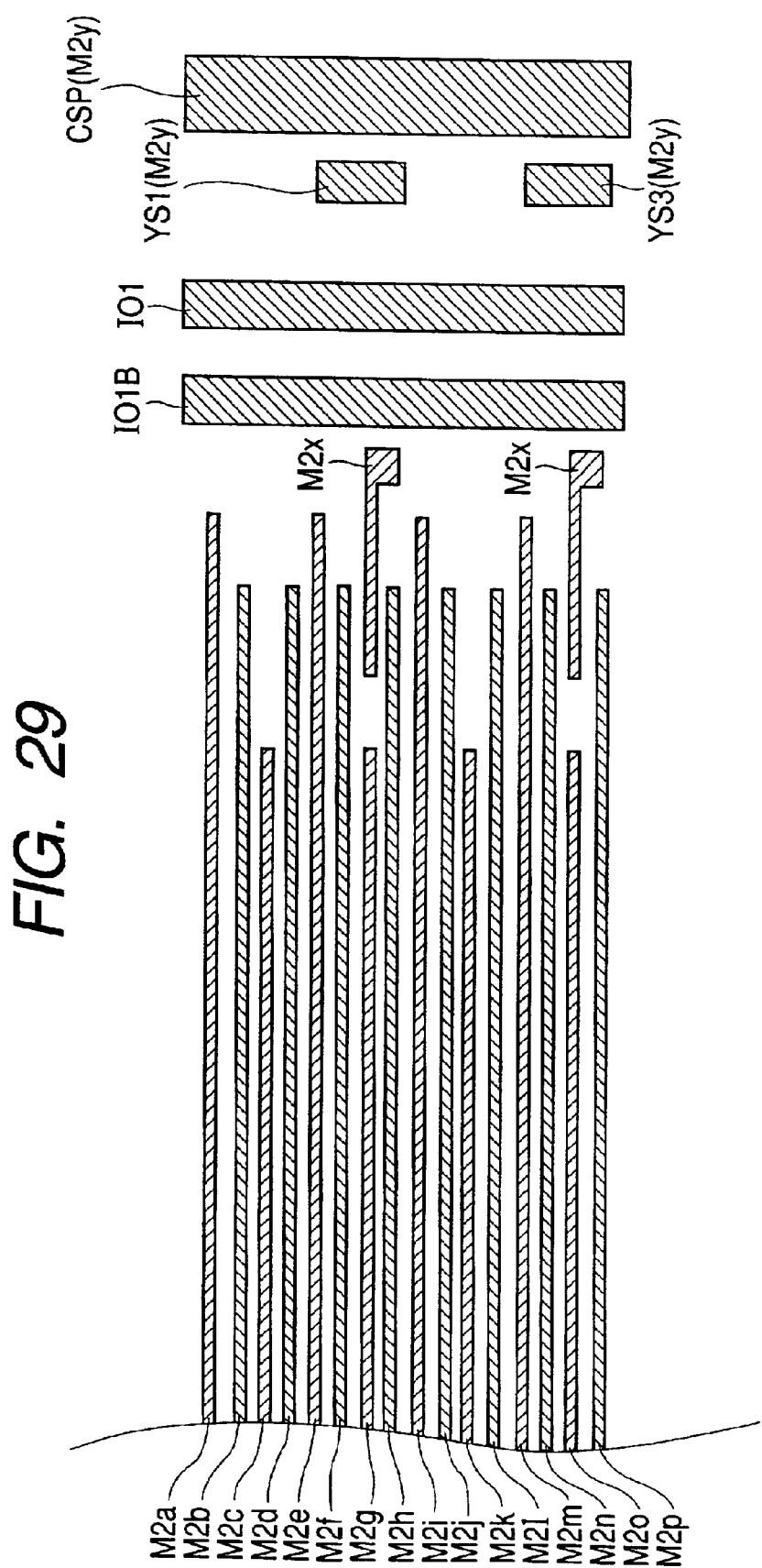
FIG. 29 is a diagram showing the layout of circuits in the peripheral circuit area of the semiconductor integrated circuit device based on a second embodiment of this invention.

As in the case of the first embodiment, it is possible to leave the areas above the precharge circuits unused for connection for second-layer lines (M2x) other than the M2a–M2p which are connected with the bit lines (refer to FIG. 28 and FIG. 29).

Figure 30:
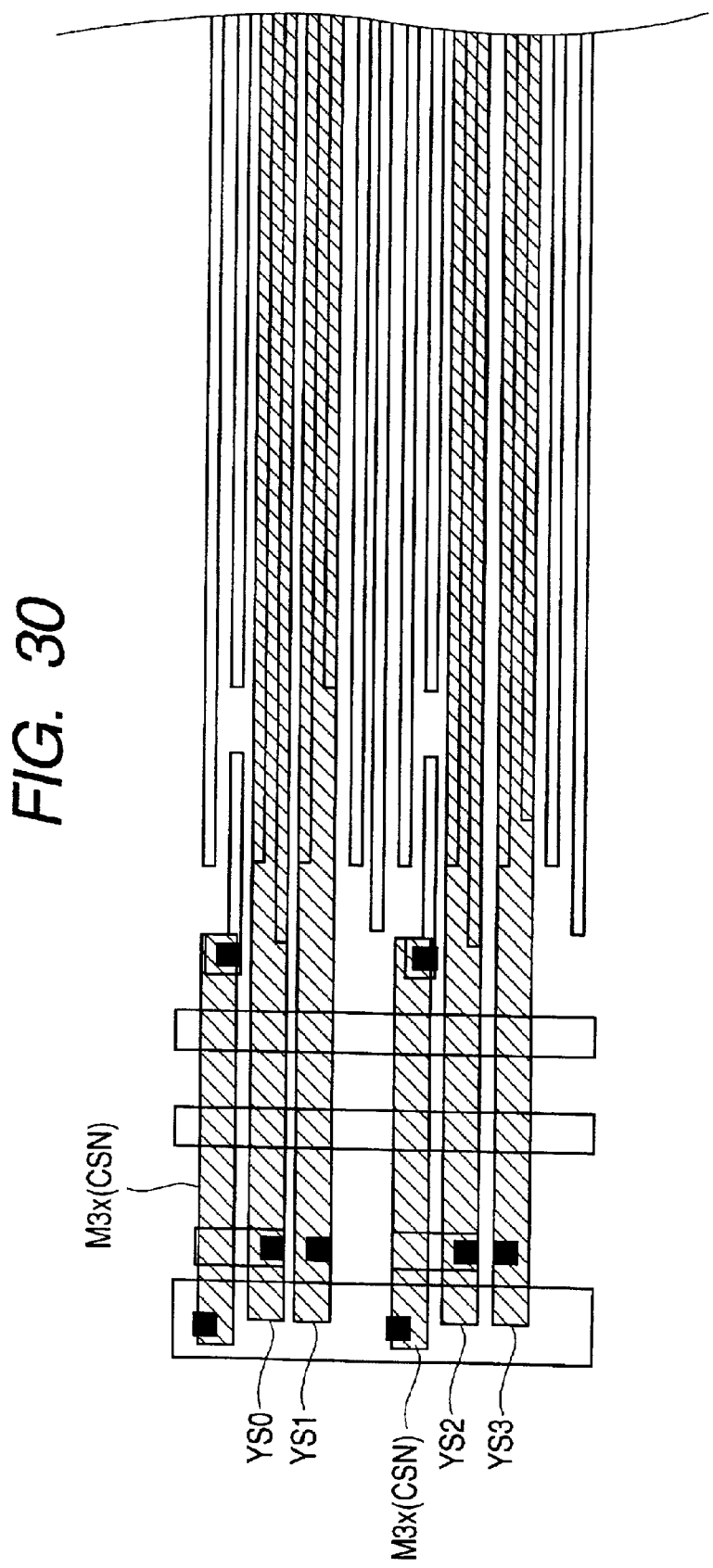
FIG. 30 is a diagram showing the layout of circuits in the peripheral circuit area of the semiconductor integrated circuit device based on a second embodiment of this invention.
Figure 31:
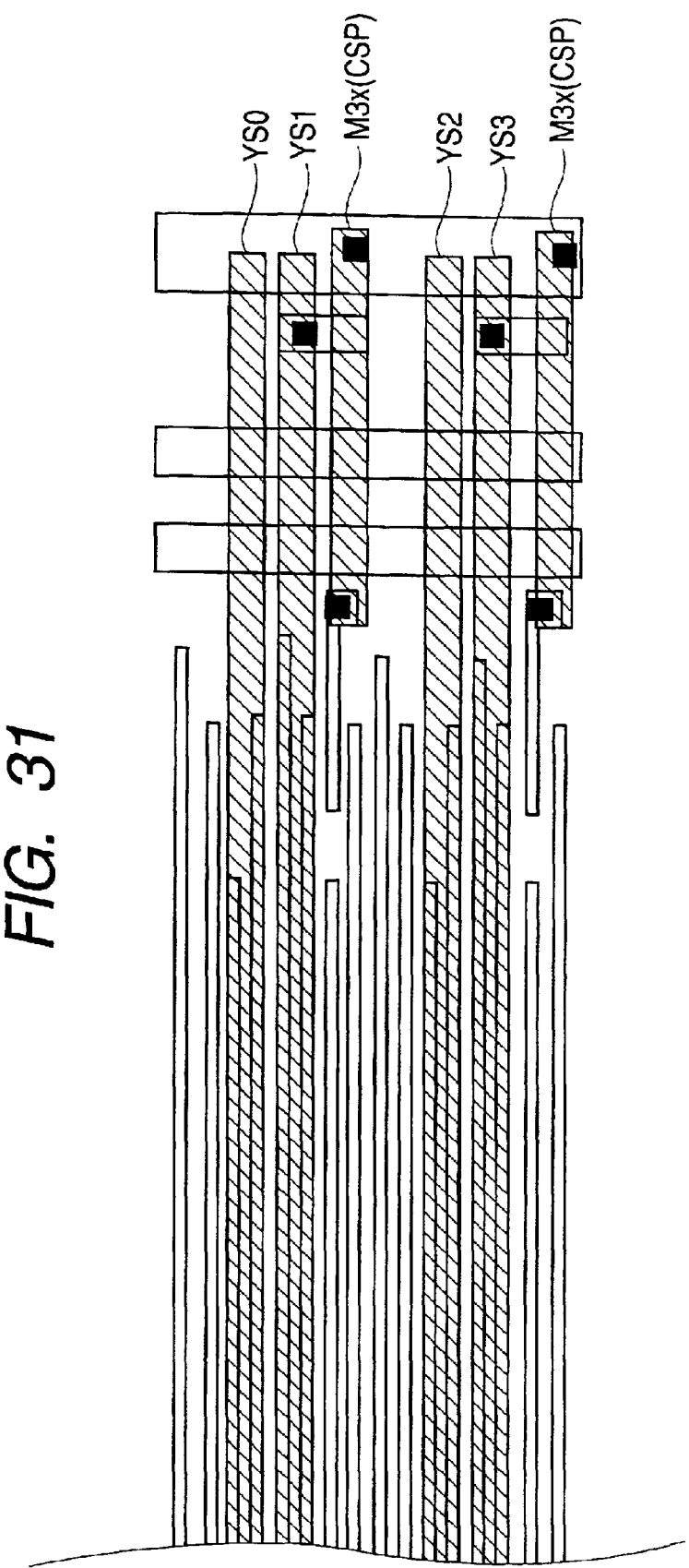
FIG. 31 is a diagram showing the layout of circuits in the peripheral circuit area of the semiconductor integrated circuit device based on a second embodiment of this invention.
Figure 32:
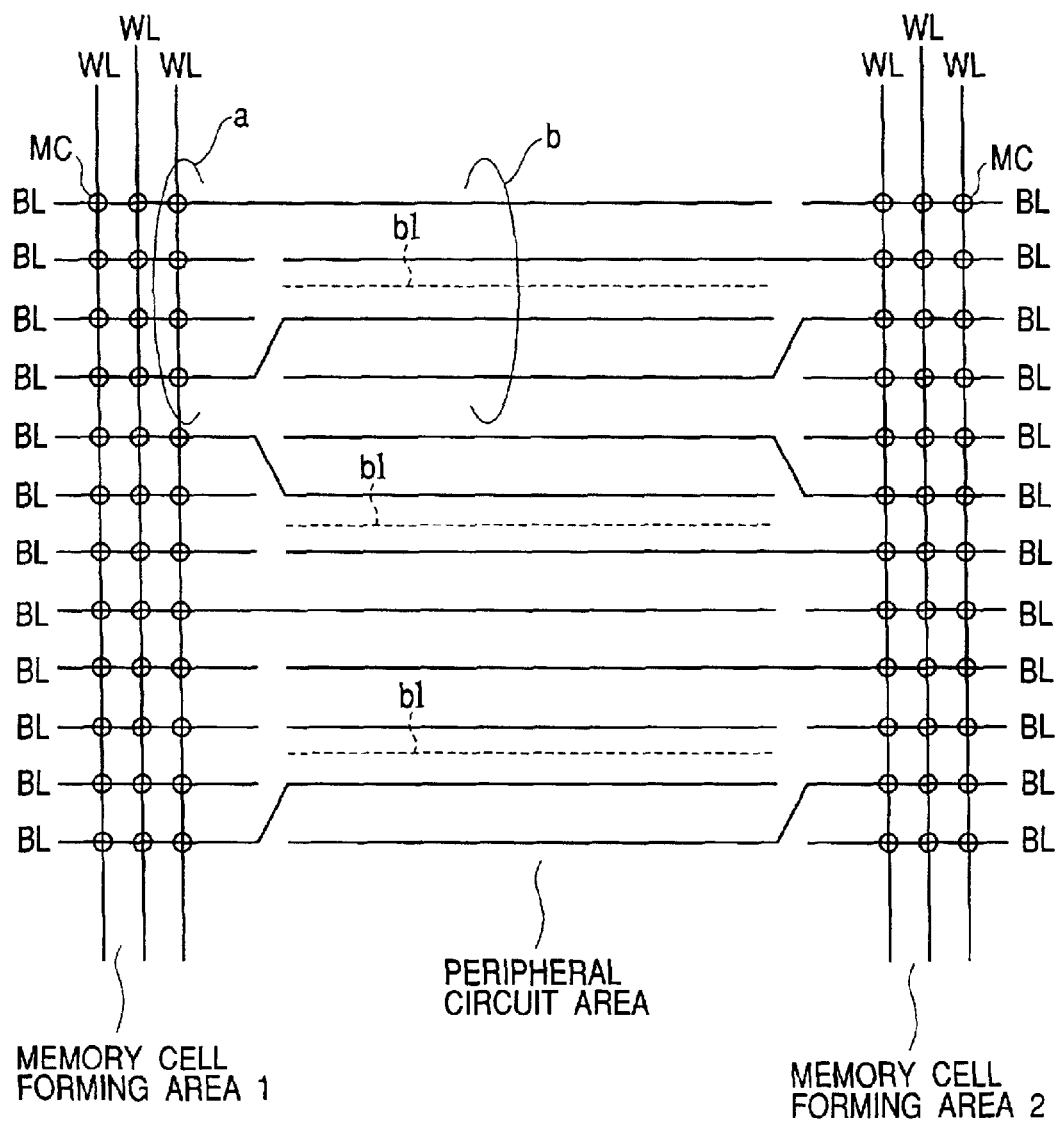
FIG. 32 is a diagram used to explain the subject of this invention.

FIG. 30 and FIG. 31 show the circuit layout, with the third-layer lines M3 (YS0–YS3, etc.) being formed over the second-layer lines (M2a–M2p, M2x, etc.) shown in FIG. 28 and FIG. 29. The connection of these lines is identical to the first embodiment, and further explanation is omitted.

Embodiment 3

While the inventive semiconductor integrated circuit devices have been explained, in which memory cells are formed in $4F^2$-areas as shown in FIG. 3 and FIG. 4, the present invention is also applicable to semiconductor integrated circuit devices having memory cells formed in $6F^2$ or $8F^2$-areas. The following explains with reference to FIG. 33 and FIG. 34 the structure of $6F^2$-sized memory cells.

Each memory cell MC is made up of a data transfer MISFET Qs and a capacitor C, which are connected in series between a bit line BL and a ground line as shown in FIG. 2. The data transfer MISFET Qs has its gate electrode connected to a word line WL.

Figure 33:
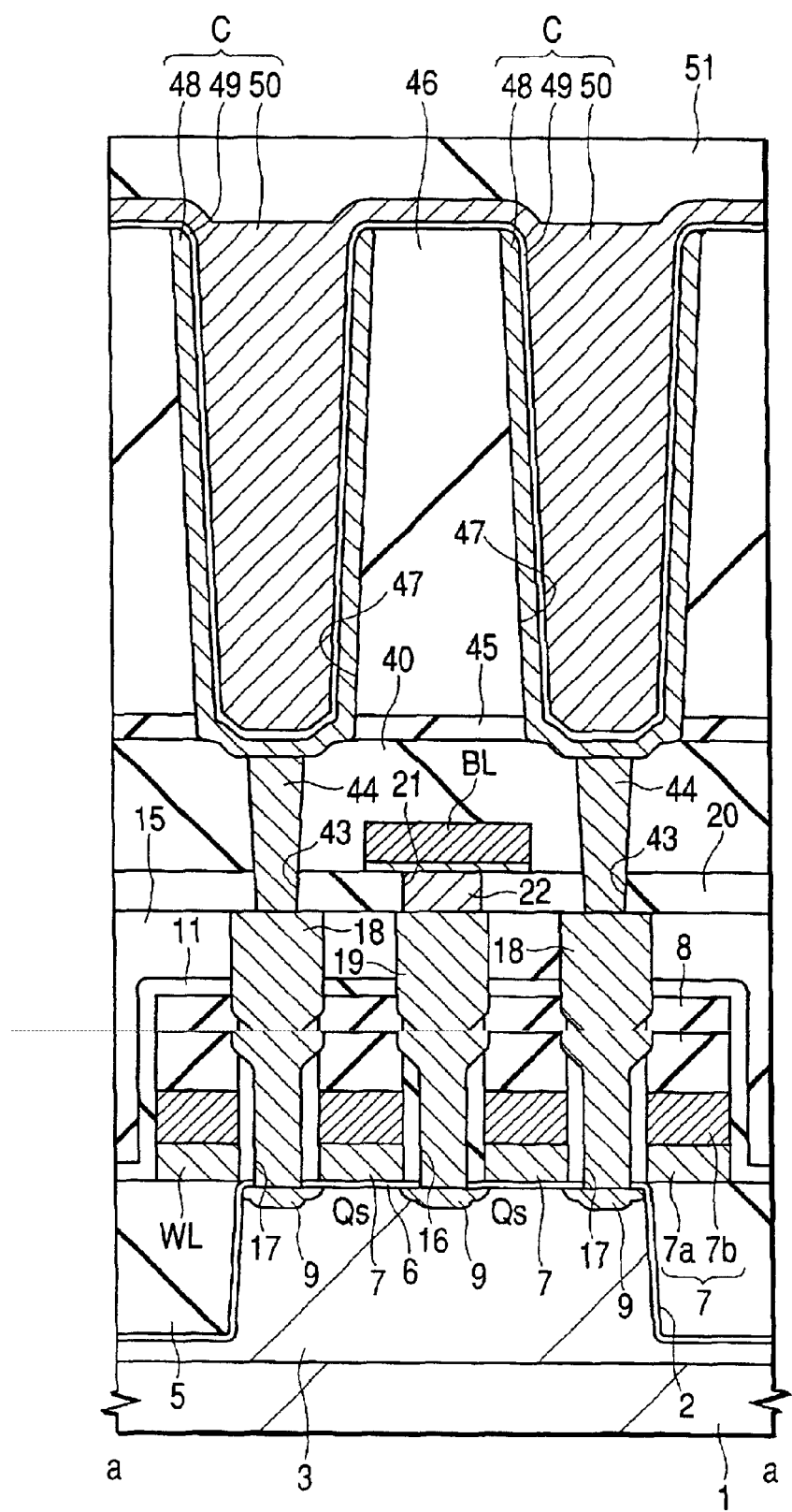
FIG. 33 is a cross-sectional diagram of the substrate, showing the principal portion of memory cells of the semiconductor integrated circuit device based on a third embodiment of this invention.
Figure 34:
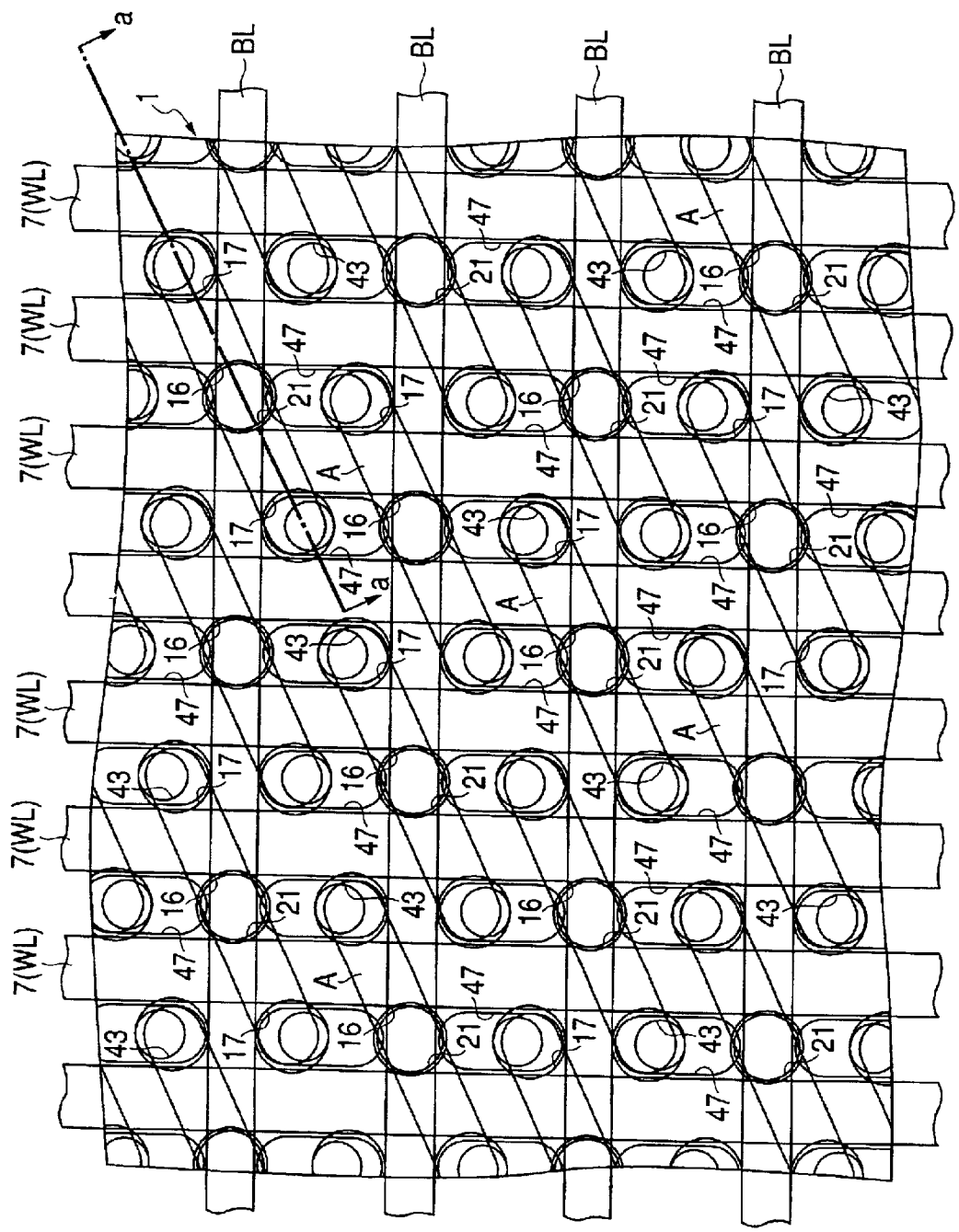
FIG. 34 is a plan view of the substrate, showing memory cells of the semiconductor integrated circuit device of the third embodiment.

FIG. 33 shows the cross section of the memory cell forming area, and FIG. 34 shows a plan view of the memory cell forming area, with the cross-sectional view of FIG. 33 being taken along the line a—a of FIG. 34. As shown in these figures, each memory cell MC is made up of a data transfer MISFET Qs and a capacitor C in serial connection with Qs both formed on the main surface 1 of a semiconductor substrate 1.

The data transfer MISFET Qs has a gate electrode 7 which is formed by being interposed by a gate oxide film 6 on a p-type well 3 which is surrounded by a cell separator 2 in the substrate 1, and source/drain regions 9 of LDD structure formed on both sides of the gate electrode 7. The gate electrode 7 is formed of laminated films of a low-resistivity polycrystalline silicon film 7a, a WN film (not shown) and a W film 7b, and is covered with silicon nitride films 11 and 15 at the top and side sections. The gate electrodes 7 formed in the memory cell forming area function as word lines WL.

The capacitor C has a lower electrode 48 formed of a polycrystalline silicon film, a capacitive insulation film 49 and an upper electrode 50 formed of a TiN film, and it is formed in a groove 47 which is formed in a silicon oxide film 46 and silicon nitride film 45.

The data transfer MISFET Qs and capacitor C are connected by a plug 18 which is formed on one source/drain region 9 and a plug 44 which is formed on the plug 18. A bit line BL is formed, by being interposed by a plug 22, on a plug 19 which is formed on another source/drain region 9. The plug 18 is formed in a contact hall 17 which is formed in the silicon oxide film 15 and silicon nitride film 11, and the plug 19 is formed in another contact hall 16 which is formed in the silicon oxide film 15 and silicon nitride film 11. The plug 22 is formed in a contact hall 21 which is formed in a silicon oxide film 20, and the plug 44 is formed in another contact hall 43 which is formed in silicon oxide films 40 and 20.

On the capacitor C, there is formed a silicon oxide film 51, on which a second-layer line M2 is formed (not shown). A third-layer line is formed on the second-layer line M2 by being interposed by an interlayer insulation film.

With the foregoing inventive $6F^2$-sized memory cells also, it is possible to reduce the interval of the second-layer lines M2 lying over the peripheral circuit area where the sense amplifier circuits, etc. are formed.

Particularly, owing to the formation of the lines on a layer (second layer) different from the layer (first layer) of the bit lines, it is possible to form the second-layer lines irrespective of the phase of bit lines and relax the restriction of line layout. In consequence, the regularity of wiring and elements including MISFETs is improved, and the reliability test of memory cells and peripheral circuits is facilitated.

Although the present invention has been described in connection with the specific embodiments, the invention is not confined to these embodiments, but various alterations are obviously possible without departing from the essence of the invention.

Particularly, the present invention, which has been explained for memory cells of DRAM structure shown in FIG. 3 and FIG. 4 as memory cells which can be formed in $4F^2$-areas, can also be applied extensively to other microstructured semiconductor integrated circuit devices including nonvolatile memories.

Among the affairs of the present invention disclosed in this specification, the major effectiveness is briefed as follows.

According to the present invention, the bit lines (data lines) BL (e.g., BL2a) which are formed on the first layer and the second-layer lines M2 (e.g., M2a) which are formed on the second layer different from the first layer are connected in the first connecting area between the first memory cell forming area and the sense amplifier area, and the bit lines BL (e.g., BL1c) which are formed on the first layer and the second-layer lines M2 (e.g., M2c) which are formed on the second layer are connected in the second connecting area between the second memory cell forming area and the sense amplifier area, whereby it is possible to reduce the interval of the second-layer lines which are connected to the respective bit lines.

Forming the data transfer lines (IO lines), precharge lines (VBLR lines), and power and ground lines (CSN and CSP lines) on the first layer, enables these lines to have a relatively large line interval, whereby a connecting section for the connection between the second-layer lines and the MISFETs, etc. (elements) formed below the first layer can readily be formed.

Forming the data transfer lines (IO lines) on the second layer enables these lines to have a sufficient thickness, whereby the delay of signals caused by a large line resistance can be prevented. Particularly, placing the Y-switch circuit area, in which the data transfer lines (IO lines), etc. are connected, between the first and second memory cell forming areas and the sense amplifier area relaxes the line layout over the Y-switch circuit area, and the data transfer lines (IO lines) can be formed here.

Forming the second-layer lines M2, which are connected to the bit lines BL, on a layer different from the layer (first layer) of the bit lines BL enables the formation of the second-layer lines irrespective of the phase relation at the formation of bit lines, whereby the interval of second-layer lines can be reduced.

What is claimed is:

1. A semiconductor integrated circuit device comprising:
   (a) a first memory array area which includes a plurality of first memory cells and first data lines which are formed on a first layer and connected with said first memory cells;
   (b) a second memory array area which includes a plurality of second memory cells and second data lines which are formed on said first layer and connected with said second memory cells;
   (c) a sense amplifier area which includes sense amplifiers;
   (d) a first connecting located between said first memory array area and said sense amplifier area; and
   (e) a second connecting area located between said second memory array area and said sense amplifier area,
   wherein aid semiconductor integrated circuit device further includes;
   (f) first lines which are formed on a second layer different from said first layer and connected with said first data lines in said first connecting area; and
   (g) second lines which are formed on said second layer and connected with said second data lines in said second connecting area,
   said sense amplifiers being connected between said first lines and said second lines and adapted to amplify voltage differences between said first lines end said second lines.

2. A semiconductor integrated circuit device according to claim 1, wherein said first memory array area, said first connecting area, said sense amplifier area, said second connecting area, and said second memory array area are located to align in this order in the extending direction of said first and second data lines.

3. A semiconductor integrated circuit device according to claim 1, wherein said first memory array area, said first connecting area, said sense amplifier area, said second connecting area, and said second memory array area are areas having virtually rectangular shapes,
   wherein said semiconductor integrated circuit device further includes a switch forming area which is located between said first memory array area and said first connecting area,
   wherein said switch forming area includes data transfer linen (IO) and switch circuits having signal transfer paths which are connected between said first data lines and said data transfer lines, said data transfer lines being formed on said second layer to extend in a direction which intersects said first lines.

4. A semiconductor integrated circuit device according to claim 2, wherein said first and second lines are laid out over said sense amplifier area.

5. A semiconductor integrated circuit device according to claim 2, wherein at least part of said first and second lines are laid out over said sense amplifier area.

6. A semiconductor integrated circuit device according to claim 2, wherein said second layer is an upper layer relative to said first layer.

7. A semiconductor integrated circuit device according to claim 2, wherein said first and second lines are formed to extend in the extending direction of said first and second data lines.

8. A semiconductor integrated circuit device according to claim 1 further including word lines which intersect said first and second data lines at right angles, said memory cells being formed at all intersections of said first and second data lines and said word lines and each made up of a data transfer MISFET and a capacitor, with the gate electrode of said MISFET being connected to a word line.

9. A semiconductor integrated circuit device according to claim 1, wherein said first lines, second lines, first data lines and second data lines are formed by use of a Levenson's line-and-space mask which is coated with shifters of alternately different phases.

10. A semiconductor integrated circuit device according to claim 1, wherein said first and second data lines have a virtually equal line spacing.

11. A semiconductor integrated circuit device according to claim 1, wherein said first and second lines and said first and second data lines have a line spacing which is equal to a minimum working dimension.

12. A semiconductor integrated circuit device according to claim 1, wherein said memory cells are each formed in an area having a size of $4F^2$ (where F denotes a minimum working dimension).

* * * * *